United States Patent
Hagihara

(10) Patent No.: US 9,918,032 B2
(45) Date of Patent: Mar. 13, 2018

(54) IMAGING DEVICE FOR REDUCING DETERIORATION OF A/D CONVERSION ACCURACY

(71) Applicant: OLYMPUS CORPORATION, Hachioji-shi, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/260,954

(22) Filed: Sep. 9, 2016

(65) Prior Publication Data

US 2016/0381315 A1   Dec. 29, 2016

Related U.S. Application Data

(63) Continuation of application No. PCT/JP2015/053657, filed on Feb. 10, 2015.

(30) Foreign Application Priority Data

Mar. 17, 2014  (JP) ................... 2014-053593

(51) Int. Cl.
H04N 5/376 (2011.01)
H04N 5/378 (2011.01)
(Continued)

(52) U.S. Cl.
CPC .......... *H04N 5/3765* (2013.01); *H04N 5/378* (2013.01); *H04N 5/37455* (2013.01); *H04N 5/37457* (2013.01); *H03M 1/56* (2013.01)

(58) Field of Classification Search
CPC ............. H04N 5/3765; H04N 5/37455; H04N 5/37457; H04N 5/378; H03M 1/56
See application file for complete search history.

(56) References Cited

U.S. PATENT DOCUMENTS

2009/0128676 A1   5/2009  Tanaka
2013/0146751 A1*  6/2013  Hagihara ............. G04F 10/005
                                            250/208.1

FOREIGN PATENT DOCUMENTS

JP   2009-124514 A   6/2009
JP   2011-55196 A    3/2011
JP   2012-39386 A    2/2012

OTHER PUBLICATIONS

Uchida et al., "Low-Power-Consumption Driving in Single-Slope ADC with Multi-phase TDC", ITE Technical Report, Jul. 2013, vol. 37, No. 29, Cited in Specification. (6 pages).
(Continued)

*Primary Examiner* — Twyler Haskins
*Assistant Examiner* — Angel L Garces-Rivera
(74) *Attorney, Agent, or Firm* — Westerman, Hattori, Daniels & Adrian, LLP

(57) ABSTRACT

An imaging device includes: an imaging section in which a plurality of pixels each having a photoelectric conversion element are arranged in a matrix shape; a clock generator that generates a plurality of phase signals having different phases; a reference signal generator that generates a reference signal which increases or decreases with a lapse of time; a comparator that is disposed to correspond to each column of an array of the plurality of pixels, performs a comparing process of comparing a pixel signal output from each pixel with the reference signal, and outputs a first comparison result signal and a second comparison result signal indicating a result of the comparing process; a latch section that is disposed to correspond to the comparator and latches logic states of the plurality of phase signals; and a latch controller.

4 Claims, 19 Drawing Sheets

(51) Int. Cl.
*H04N 5/3745* (2011.01)
*H03M 1/56* (2006.01)

(56) References Cited

OTHER PUBLICATIONS

International Search Report dated Apr. 7, 2015, issued in counterpart international application No. PCT/JP2015/053657 (1 page).

* cited by examiner

IMAGING DEVICE FOR REDUCING DETERIORATION OF A/D CONVERSION ACCURACY

CROSS REFERENCE TO RELATED APPLICATIONS

This application is a continuation application based on a PCT International Application No. PCT/JP2015/053657, filed on Feb. 10, 2015, whose priority is claimed on Japanese Patent Application No. 2014-053593, filed Mar. 17, 2014. Both of the contents of the PCT International Application and the Japanese Application are incorporated herein by reference.

BACKGROUND OF THE INVENTION

Field of the Invention

The present invention relates to an imaging device.

Description of Related Art

A constitution described in Japanese Unexamined Patent Application, First Publication No. 2011-55196 is known as an example of an imaging device using a tdcSS (time to digital converter Single Slope) type AD conversion circuit in which a TDC (Time to Digital Converter) type AD conversion circuit and an SS (Single Slope) type AD conversion circuit are combined. FIG. 16 illustrates a part of a constitution of a tdcSS type AD conversion circuit according to a first conventional example. A constitution and an operation of a circuit illustrated in FIG. 16 will be described below.

The circuit illustrated in FIG. 16 includes a comparator 1031, a latch section 1033, a counter 1034, and a buffer circuit BUF. The comparator 1031 includes a voltage comparator COMP to which a reference signal Ramp decreasing with the lapse of time is input along with an analog signal Signal to be subjected to AD conversion and which outputs a comparison signal CO based on a comparison result of the analog signal Signal with the reference signal Ramp. The latch section 1033 includes a plurality of latch circuits L_0 to L_7 that latch logic states of a plurality of phase signals CK[0] to CK[7] having different phases. The counter 1034 includes a counter circuit CNT that performs a counting operation on the basis of the phase signal CK[7] output from the latch circuit L_7. A control signal RST is a signal for resetting the counter circuit CNT.

In the comparator 1031, a time interval (magnitude in a time axis direction) based on the amplitude of the analog signal Signal is generated. The buffer circuit BUF is an inverting buffer circuit that inverts and outputs an input signal.

The latch circuits L_0 to L_7 of the latch section 1033 are in an enabled (effective, active) state and output the input phase signals CK[0] to CK[7] without any change when a control signal Hold from the buffer circuit BUF is in an H state (high state). The latch circuits L_0 to L_7 are switched to a disabled (ineffective, hold) state and latch the logic states of the input phase signals CK[0] to CK[7] when the control signal Hold from the buffer circuit BUF is changed from the H state to an L state (low state).

The operation of the circuit according to the first conventional example will be described below. FIG. 17 illustrates waveforms of a reference signal Ramp, an analog signal Signal, a start pulse StartP, phase signals CK[0] to CK[7], a comparison signal CO, a control signal Hold from the buffer circuit BUF, and output signals Q0 to Q7 of the latch circuits L_0 to L_7 of the latch section 1033. The horizontal direction in FIG. 17 represents time and the vertical direction in FIG. 17 represents voltage.

First, at a first timing relevant to start of comparison in the comparator 1031, generation of the phase signals CK[0] to CK[7] is started and the generated phase signals CK[0] to CK[7] are input to the latch circuits L_0 to L_7 of the latch section 1033. Since the control signal Hold from the buffer circuit BUF is in the H state, the latch circuits L_0 to L_7 are in the enabled state and output the phase signals CK[0] to CK[7] without any change.

The counter 1034 performs a counting operation on the basis of the phase signal CK[7] output from the latch circuit L_7 of the latch section 1033. In this counting operation, the counted value increases or decreases at a rising or falling timing of the phase signal CK[7]. At a second timing at which the analog signal Signal and the reference signal Ramp are substantially equal to each other in voltage, the comparison signal CO from the comparator 1031 is inverted. After the comparison signal CO is buffered by the buffer circuit BUF, the control signal Hold from the buffer circuit BUF is changed to the L state at a third timing.

Accordingly, the latch circuits L_0 to L_7 are changed to the disabled state. At this time, the logic states of the phase signals CK[0] to CK[7] are latched in the latch circuits L_0 to L_7. The counter 1034 latches the counted value by stopping the operation of the latch circuit L_7. Digital data corresponding to the analog signal Signal is obtained based on the logic states latched by the latch section 1033 and the counted value latched by the counter 1034.

A constitution described in Japanese Unexamined Patent Application, First Publication No. 2012-39386 has also been proposed. FIG. 18 illustrates a part of a constitution of a tdcSS type AD conversion circuit according to a second conventional example. A constitution and an operation of a circuit illustrated in FIG. 18 will be described below.

The circuit illustrated in FIG. 18 includes a comparator 1031, a latch controller 1032, a latch section 1033, and a counter 1034. The comparator 1031 and the counter 1034 are identical to the comparator 1031 and the counter 1034 illustrated in FIG. 16.

The latch controller 1032 includes an inverting delay circuit DLY and an AND circuit AND1 and generates a control signal for controlling the operation of the latch section 1033. A comparison signal CO from the comparator 1031 is input to the inverting delay circuit DLY. The inverting delay circuit DLY outputs a comparison signal xCO_D which is obtained by inverting and delaying the comparison signal CO. The comparison signal xCO_D from the inverting delay circuit DLY and the comparison signal CO from the comparator 1031 are input to the AND circuit AND1. The AND circuit AND1 outputs a control signal Hold_L which is a logical product (AND) of the comparison signal xCO_D and the comparison signal CO.

The latch section 1033 includes latch circuits L_0 to L_7 and an AND circuit AND2. The latch circuits L_0 to L_7 are identical to the latch circuits L_0 to L_7 illustrated in FIG. 16. The AND circuit AND2 outputs a control signal Hold_C which is a logical product (AND) of the comparison signal xCO_D from the inverting delay circuit DLY of the latch controller 1032 and a control signal Enable to the latch circuit L_7.

The operation of the circuit according to the second conventional example will be described below. FIG. 19 illustrates waveforms of a start pulse StartP, phase signals CK[0] to CK[7], a comparison signal xCO_D, a comparison signal CO, a control signal Hold_L from the AND circuit AND1, a control signal Enable, a control signal Hold_C from the AND circuit AND2, and output signals Q0 to Q7 of the latch circuits L_0 to L_7 of the latch section 1033. The horizontal direction in FIG. 19 represents time and the vertical direction in FIG. 19 represents voltage.

An operation different from the operation of the circuit according to the first conventional example will be described below. After a first timing relevant to start of comparison in the comparator 1031 and until the analog signal Signal input to the comparator 1031 and the reference signal Ramp are substantially equal to each other in voltage, the comparison signal CO from the comparator 1031 is in the L state. While the comparison signal CO is in the L state, the comparison signal xCO_D from the inverting delay circuit DLY is in the H state. Since the comparison signal xCO_D from the inverting delay circuit DLY is in the H state and the comparison signal CO from the comparator 1031 is in the L state, the control signal Hold_L from the AND circuit AND1 is in the L state. Accordingly, the latch circuits L_0 to L_6 are in the disabled state.

On the other hand, at the first timing relevant to the start of comparison in the comparator 1031, since the control signal Enable is in the H state and the comparison signal xCO_D from the inverting delay circuit DLY is in the H state, the control signal Hold_C from the AND circuit AND2 is in the H state. Accordingly, the latch circuit L_7 is in the enabled state.

Subsequently, at a second timing at which the analog signal Signal and the reference signal Ramp are substantially equal to each other in voltage, the comparison signal CO from the comparator 1031 is inverted. Since the comparison signal xCO_D from the inverting delay circuit DLY is in the H state and the comparison signal CO from the comparator 1031 is changed from the L state to the H state, the control signal Hold_L from the AND circuit AND1 is changed from the L state to the H state. Accordingly, the latch circuits L_0 to L_6 are in the enabled state.

At a third timing at which a predetermined time elapses from the timing at which the comparison signal CO from the comparator 1031 is inverted, the comparison signal xCO_D from the inverting delay circuit DLY is changed from the H state to the L state. Accordingly, since the control signal Hold_L of the AND circuit AND1 and the control signal Hold_C of the AND circuit AND2 are changed from the H state to the L state, the latch circuits L_0 to L, 7 are in the disabled state.

In the above-mentioned operation, since the latch circuits L_0 to L_6 operate only in the period from the second timing to the third timing, it is possible to reduce current consumption in comparison with the first conventional example.

As a specific constitution of the inverting delay circuit DLY, a constitution employing a so-called delay line in which multiple stages of inverter circuits are connected and which is described, for example, in ITE Technical Report Vol. 37, No. 29 is considered.

SUMMARY OF THE INVENTION

According to a first aspect of the present invention, an imaging device includes: an imaging section in which a plurality of pixels each having a photoelectric conversion element are arranged in a matrix shape; a clock generator that generates a plurality of phase signals having different phases; a reference signal generator that generates a reference signal which increases or decreases with a lapse of time; a comparator that is disposed to correspond to each column or columns of an array of the plurality of pixels, performs a comparing process of comparing a pixel signal output from each pixel with the reference signal, and outputs a first comparison result signal and a second comparison result signal indicating a result of the comparing process; a latch section that is disposed to correspond to the comparator and latches logic states of the plurality of phase signals; and a latch controller that is disposed to correspond to the comparator, activates the latch section depending on a comparison result indicated by the first comparison result signal, and causes the latch section to perform a latching operation depending on a comparison result indicated by the second comparison result signal. The comparator includes: a differential amplifier that includes a first transistor to a gate of which the reference signal is input and a second transistor to a gate of which the pixel signal is input, outputs a standard signal at a time of initialization of voltages of the gate of the first transistor and the gate of the second transistor, and outputs a first comparison signal corresponding to a result of comparing the reference signal with the pixel signal at a time of performing the comparing process; a third transistor that is a transistor operating as a constant current source, has a source electrically connected to a voltage source, and outputs a current at the time of performing the comparing process; and a first capacitive element that has a first terminal electrically connected to a gate of the third transistor and a second terminal electrically connected to the voltage source, samples a standard voltage based on the standard signal at the time of the initialization, and outputs the standard voltage to the first terminal at the time of performing the comparing process. The first comparison result signal is generated from the first comparison signal. The second comparison result signal is generated from an output of a drain of the third transistor. A timing at which a state of the second comparison result signal is changed is later than a timing at which a state of the first comparison result signal is changed.

According to a second aspect of the present invention, the imaging device according to the first aspect may further include: a first switching element that electrically connects the gate and a drain of the first transistor at the time of the initialization and electrically disconnects the gate and the drain of the first transistor at the time of performing the comparing process; a second switching element that electrically connects the gate and a drain of the second transistor at the time of the initialization and electrically disconnects the gate and the drain of the second transistor at the time of performing the comparing process; a second capacitive element that has a first terminal electrically connected to the gate of the first transistor and a second terminal to which the reference signal is input and samples a voltage of the drain of the first transistor at the time of the initialization; and a third capacitive element that has a first terminal electrically connected to the gate of the second transistor and a second terminal to which the pixel signal is input and samples a voltage of the drain of the second transistor at the time of the initialization.

According to a third aspect of the present invention, in the imaging device according to the second aspect, the first transistor and the second transistor may be transistors of a first conductivity type. The third transistor may be a transistor of a second conductivity type. The comparator may include: a fourth transistor of the first conductivity type, to a gate of which the standard signal and the first comparison signal are input; a fifth transistor of the first conductivity type, whose drain is electrically connected to a source of the fourth transistor; a sixth transistor of the first conductivity type, to a gate of which a signal output from a junction point of the fourth transistor and the fifth transistor is input and a drain thereof is electrically connected to the drain of the third transistor; and a third switching element that electrically connects the drain of the third transistor and the first terminal of the first capacitive element at the time of the initialization and electrically disconnects the drain of the third transistor and the first terminal of the first capacitive element at the time of performing the comparing process. The first capacitive element may sample the standard voltage which is a voltage of the drain of the third transistor at the time of the initialization. The second comparison result signal may be output from a junction point of the third transistor and the sixth transistor.

According to a fourth aspect of the present invention, in the imaging device according to the second aspect, the first transistor and the second transistor may be transistors of a first conductivity type. The third transistor may be a transistor of a second conductivity type. The comparator may further include: a fourth transistor of the first conductivity type, to a gate of which the standard signal and the first comparison signal are input and whose drain is electrically connected to the drain of the third transistor; and a third switching element that electrically connects the drain of the third transistor and the first terminal of the first capacitive element at the time of the initialization and electrically disconnects the drain of the third transistor and the first terminal of the first capacitive element at the time of performing the comparing process. The first capacitive element may sample the standard voltage which is a voltage of the drain of the third transistor at the time of the initialization. The second comparison result signal may be output from a junction point of the third transistor and the fourth transistor.

According to a fifth aspect of the present invention, in the imaging device according to the second aspect, the first transistor, the second transistor, and the third transistor may be transistors of a first conductivity type. The comparator may further include: a fourth transistor of the second conductivity type, to a gate of which the standard signal and the first comparison signal are input; a fifth transistor of the first conductivity type, whose drain is electrically connected to a drain of the fourth transistor; a sixth transistor of the second conductivity type, to a gate of which a signal output from a junction point of the fourth transistor and the fifth transistor is input and a drain thereof is electrically connected to the drain of the third transistor; and a third switching element that electrically connects the drain of the fifth transistor and the first terminal of the first capacitive element at the time of the initialization and electrically disconnects the drain of the fifth transistor and the first terminal of the first capacitive element at the time of performing the comparing process. The first capacitive element may sample the standard voltage which is a voltage of the drain of the fifth transistor at the time of the initialization. The second comparison result signal may be output from a junction point of the third transistor and the sixth transistor.

According to a sixth aspect of the present invention, in the imaging device according to the fifth aspect, the comparator may further include a fourth capacitive element that has a first terminal electrically connected to the gate of the fourth transistor and a second terminal electrically connected to the drain of the fourth transistor.

DETAILED DESCRIPTION OF THE INVENTION

Hereinafter, embodiments of the present invention will be described with reference to the accompanying drawings.

First Embodiment

Figure 1:
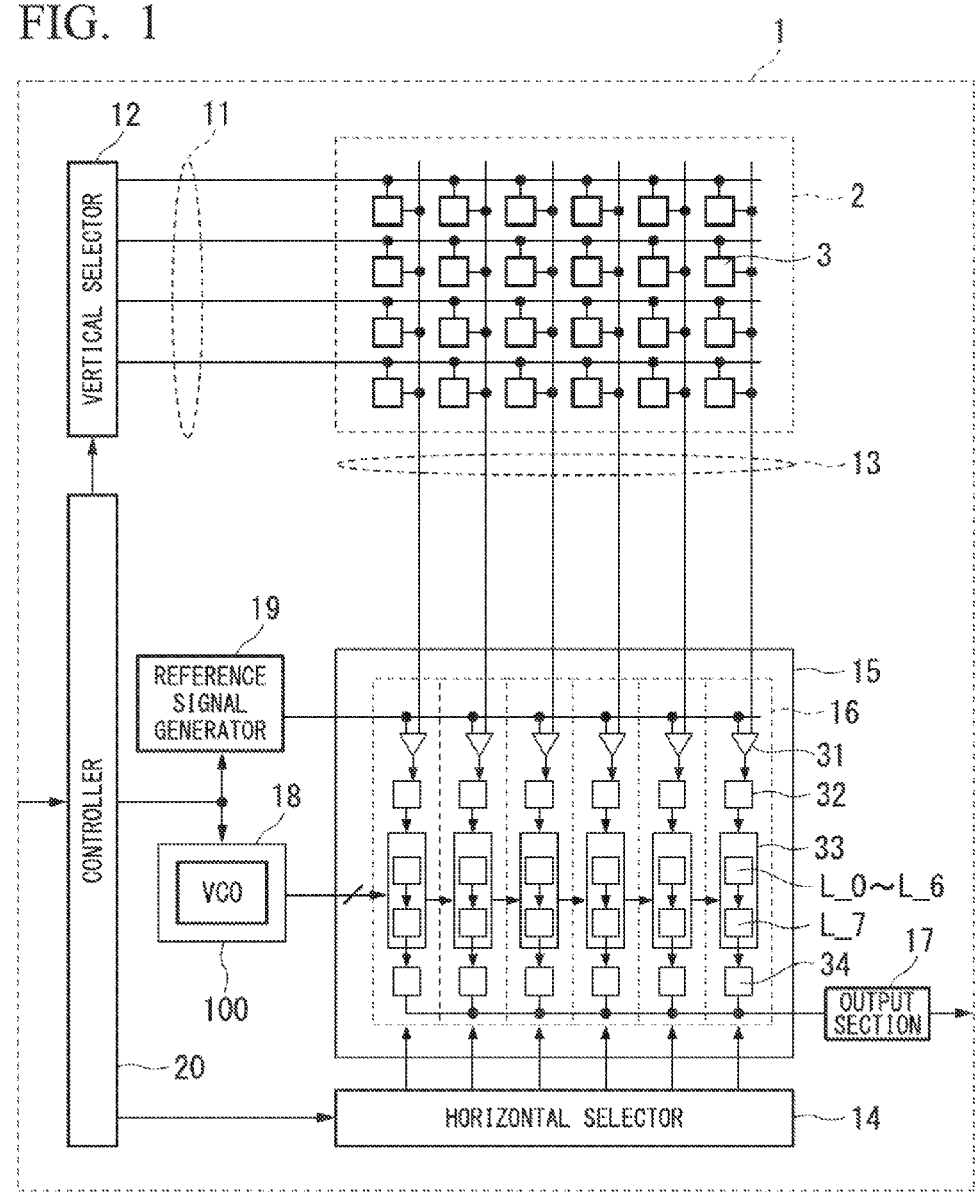
FIG. 1 is a block diagram illustrating a constitution of an imaging device according to a first embodiment of the present invention.

First, a first embodiment of the present invention will be described below. FIG. 1 illustrates an example of a constitution of an imaging device according to this embodiment. The imaging device 1 illustrated in FIG. 1 includes an imaging section 2, a vertical selector 12, a horizontal selector 14, a column processor 15, an output section 17, a clock generator 18, a reference signal generator 19, and a controller 20.

The imaging section 2 has a constitution in which a plurality of unit pixels 3 each having a photoelectric conversion element are arranged in a matrix shape. Each unit pixel 3 generates a pixel signal corresponding to the amount of incident electromagnetic waves and outputs a pixel signal to a vertical signal line 13 which is disposed for each column. The vertical selector 12 selects a row of the imaging section 2. The clock generator 18 generates a plurality of phase signals having different phases. The reference signal generator 19 generates a reference signal (ramp wave) which increases or decreases with the lapse of time. The column processor 15 includes a column AD converter 16 that AD-converts the pixel signals output from the unit pixels 3. The horizontal selector 14 reads the AD-converted digital data to a horizontal signal line. The output section 17 outputs the digital data read by the horizontal selector 14 to a circuit in a subsequent stage. The controller 20 controls each unit.

In FIG. 1, the imaging section 2 including 4×6 unit pixels 3 is illustrated for the purpose of simplification, but the number of rows and the number of columns of the array of the unit pixels 3 have only to be natural numbers equal to or greater than 2. In practice, several tens to several tens of thousands of unit pixels 3 are arranged in each row or each column of the imaging section 2. Although not illustrated in the drawing, each unit pixel 3 of the imaging section 2 includes a photoelectric conversion element such as a photo diode/photo gate/photo transistor and a transistor circuit.

Details of the units will be described below. In the imaging section 2, the unit pixels 3 are arranged two-dimensionally in 4 rows×6 columns. In the pixel array of 4 rows×6 columns, a row control line 11 is disposed for each row. An end of each row control line 11 is connected to an output terminal corresponding to each row of the vertical selector 12. The vertical selector 12 is constituted by a shift register, a decoder, or the like and performs control of row address or row scan of the imaging section 2 via the row control lines 11 when each unit pixel 3 of the imaging section 2 is driven. In the pixel array of the imaging section 2, a vertical signal line 13 is disposed for each column.

The column processor 15 includes, for example, a column AD converter 16 which is disposed for each column of the pixel array of the imaging section 2, that is, for each vertical signal line 13. The column AD converter 16 converts an analog pixel signal, which is read from each unit pixel 3 of the imaging section 2 via the vertical signal line 13 for each column, into digital data. In this example, the column AD converter 16 is disposed for each column of the pixel array of the imaging section 2 in one-to-one correspondence, but this is only an example and the present invention is not limited to this arrangement. For example, a single column AD converter 16 may be disposed for a plurality of columns of the pixel array of the imaging section 2 and the single column AD converter 16 may be used for a plurality of columns in a time division manner. The column processor 15 along with the reference signal generator 19 to be described later constitutes analog-digital conversion means (AD conversion circuit) that converts the analog pixel signals read from the unit pixels 3 of the selected row of the imaging section 2 into digital pixel data.

The clock generator 18 is constituted by a voltage controlled oscillator (VCO) 100 which is a ring-shaped delay circuit and a symmetric oscillation circuit in which a plurality of delay sections (inversion elements) are connected in a ring shape, and outputs phase signals having a constant phase difference from the delay sections. An asymmetric oscillation circuit in which the number of output phase signals is a power of 2 or the like may be used for the clock generator 18. The ring-shaped delay circuit is suitable as the clock generator 18, but the clock generator is not limited to the ring-shaped delay circuit.

The reference signal generator 19 is constituted, for example, by an integration circuit, generates a reference signal, that is, a ramp wave, in which the level varies in an inclined shape with the lapse of time under the control of the controller 20, and supplies the reference signal to the column AD converter 16 of the column processor 15 via a reference signal line. The reference signal generator 19 is not limited to the integration circuit, but a DAC circuit may be used. When a constitution in which the DAC circuit is used to digitally generate a ramp wave is employed, it is necessary to make steps of the ramp wave narrower or to employ a constitution equivalent thereto.

The horizontal selector 14 is constituted by a shift register, a decoder, or the like and performs control of column address or column scan of the column AD converter 16 of the column processor 15. The digital data AD-converted by the column AD converter 16 is sequentially read to the output section 17 via the horizontal signal lines under the control of the horizontal selector 14.

The controller 20 includes a functional block of a timing generator (TG) that supplies clocks required for operations of the units such as the vertical selector 12, the clock generator 18, the reference signal generator 19, the horizontal selector 14, the column processor 15, and the output section 17 or a pulse signal of a predetermined timing and a functional block that communicates with the TG.

The output section 17 outputs binarized digital data. The output section 17 may have signal processing functions such as black level adjustment, column unevenness correction, and color processing built therein in addition to a buffering function. The output section 17 may convert n-bit parallel digital data into serial data and output the serial data.

The constitution of the column AD converter 16 will be described below. Each column AD converter 16 generates a pulse signal having a magnitude in the time axis direction (pulse width) corresponding to the magnitude of the pixel signal by comparing the analog pixel signal read from each unit pixel 3 of the imaging section 2 with the reference signal to be subjected to AD conversion which is supplied from the reference signal generator 19. The column AD converter 16 performs AD conversion by converting data corresponding to the period of the pulse width of the pulse signal into digital data corresponding to the magnitude of the pixel signal.

Details of the constitution of the column AD converter 16 will be described below. The column AD converter 16 is disposed for each column of the pixel array of the imaging section 2. In FIG. 1, six column AD converters 16 are disposed. The column AD converters 16 corresponding to the columns have the same constitution. The column AD converter 16 includes a comparator 31, a latch controller 32, a latch section 33, and a counter 34.

The comparator 31 is disposed to correspond to each column of the pixel array of the imaging section 2. As described above, since the column AD converter 16 may be disposed for a plurality of columns of the pixel array of the imaging section 2, the comparator 31 may be disposed for a plurality of columns of the pixel array of the imaging section 2. That is, the comparator 31 is disposed for each column or every plurality of columns of the pixel array of the imaging section 2.

The comparator 31 converts the magnitude of the pixel signal into information in the time axis direction (the pulse width of the pulse signal) by comparing a signal voltage corresponding to the analog pixel signal output from the unit pixel 3 of the imaging section 2 via the vertical signal line 13 with the ramp voltage of the reference signal supplied from the reference signal generator 19. For example, the comparison signal output from the comparator 31 has a high level (H level) when the ramp voltage is higher than the signal voltage and has a low level (L level) when the ramp voltage is equal to or lower than the signal voltage.

The comparator 31 starts the comparing process of comparing the pixel signal output from the unit pixel 3 with the reference signal at a first timing, and ends the comparing process at a second timing at which the reference signal satisfies a predetermined condition for the pixel signal (at a timing at which the reference signal and the pixel signal are substantially equal to each other in voltage in this example). The comparison signal from the comparator 31 is inverted at a timing at which the comparator 31 ends the comparing process.

The latch section 33, the latch controller 32, and the counter 34 are arranged to correspond to the comparator 31. The latch section 33 includes a plurality of latch circuits L_0 to L_7 that latch (hold/store) logic states of a plurality of phase signals output from the clock generator 18. Encoding is performed by the output section 17 on the basis of the logic states of the plurality of phase signals latched by the latch section 33, and data of low-order bits (low-order data) constituting digital data is obtained.

The latch controller 32 generates a control signal for controlling the operation of the latch section 33. The latch controller 32 activates the latch section 33 at the second timing and causes the latch section 33 to perform a latching operation at a third timing at which a time based on a current (current of the comparison signal) output from the comparator 31 elapses from the second timing.

The counter 34 performs a counting operation on the basis of the phase signal (the phase signal CK[7] in this example) output from the clock generator 18. By causing the counter 34 to perform the counting operation, data of high-order bits (high-order data) constituting the digital data is obtained.

Here, signals corresponding to the logic states of the plurality of phase signals CK[0] to CK[7] latched by the latch section 33 are, for example, 8-bit data. The high-order data signal constituted by the counted value of the counter 34 is, for example, 10-bit data. 10 bits are only an example and the data signal may have a number of bits (for example, 8 bits) less than 10 bits, a number of bits (for example, 12 bits) larger than 10 bits, or the like.

The operations in this example will be described below. Here, the specific operation of each unit pixel 3 will not be described, but a reset level and a signal level are output from each unit pixel 3 as is widely known.

The AD conversion is performed as follows. For example, digital data corresponding to the magnitude of a pixel signal is acquired by comparing a reference signal decreasing with a predetermined slope with a pixel signal in voltage and measuring a length of a period from a time point (the first timing) at which the comparing process is started to a time point (the third timing) at which a predetermined time additionally elapses after the voltage of the reference signal (the ramp voltage) becomes equal to the voltage of the pixel signal (the second timing) on the basis of the counted value of the counter 34 and the encoded value of the logic states of the plurality of phase signals CK[0] to CK[7] latched by the latch section 33.

In this embodiment, the AD conversion is performed on the reset level and the signal level read from each unit pixel 3. More specifically, the reset level including noise of the pixel signal is read from each unit pixel 3 of the selected row of the imaging section 2 in a first reading operation and is AD-converted, and the signal level corresponding to the amount of electromagnetic waves incident on the unit pixel 3 is read in a second reading operation and is AD-converted. Thereafter, by digitally performing a subtraction process (CDS process) of the reset level and the signal level, digital data corresponding to the signal component is acquired. The signal level may be read and AD-converted in the first reading operation and the reset level may be read and AD-converted in the subsequent second reading operation. The present invention is not limited to this example.

(First Reading)

After the pixel signal (reset level) output from the unit pixels 3 in an arbitrary row of the pixel array of the imaging section 2 to the vertical signal line 13 is stabilized, the controller 20 supplies control data for generating a reference signal to the reference signal generator 19. The reference signal generator 19 receiving the control data outputs the reference signal, the waveform of which varies in a ramp shape with the lapse of time as a whole, as a comparison voltage to be supplied to a first input terminal of the comparator 31. The comparator 31 compares the reference signal with the pixel signal. The latch controller 32 changes the latch circuit L_7 of the latch section 33 to an enabled (effective, active) state at a timing (the first timing) at which comparison is started by the comparator 31. The counter 34 performs a counting operation using the phase signal CK[7] from the clock generator 18 as a count clock.

The comparator 31 compares the reference signal supplied from the reference signal generator 19 with the pixel signal and inverts the comparison signal when both voltages are substantially equal to each other (the second timing). When the comparison signal from the comparator 31 is inverted, the latch controller 32 changes the latch circuits L_0 to L_6 of the latch section 33 to the enabled state.

When the comparison signal from the comparator 31 is inverted and then the control signal from the latch controller 32 is inverted in the inversion (at the third timing), the latch circuits L_0 to L_7 of the latch section 33 are changed to the disabled (ineffective, hold) state and latch the logic states of the plurality of phase signals CK[0] to CK[7] from the clock generator 18. At the same time, the counter 34 latches the counted value. Accordingly, digital data corresponding to the reset level is obtained. When a predetermined period elapses, the controller 20 stops supply of control data to the reference signal generator 19 and output of the phase signals from the clock generator 18. Accordingly, the reference signal generator 19 stops generation of the reference signal.

(Second Reading)

After the pixel signal (signal level) output from the unit pixels 3 in an arbitrary row of the pixel array of the imaging section 2 to the vertical signal line 13 is stabilized, the controller 20 supplies control data for generating a reference signal to the reference signal generator 19. The reference signal generator 19 receiving the control data outputs the reference signal, the waveform of which varies in a ramp shape with the lapse of time as a whole, as a comparison voltage to be supplied to the first input terminal of the comparator 31. The comparator 31 compares the reference signal with the pixel signal. The latch controller 32 changes the latch circuit L_7 of the latch section 33 to an enabled state at a timing (the first timing) at which comparison is started by the comparator 31. The counter 34 performs a counting operation using the phase signal CK[7] from the clock generator 18 as a count clock.

The comparator 31 compares the reference signal supplied from the reference signal generator 19 with the pixel signal and inverts the comparison signal when both voltages are substantially equal to each other (the second timing). When the comparison signal from the comparator 31 is inverted, the latch controller 32 changes the latch circuits L_0 to L_6 of the latch section 33 to the enabled state.

When the comparison signal from the comparator 31 is inverted and then the control signal from the latch controller 32 is inverted in the inversion (the third timing), the latch circuits L_0 to L_7 of the latch section 33 are changed to the disabled state and latch the logic states of the plurality of phase signals CK[0] to CK[7] from the clock generator 18. At the same time, the counter 34 latches the counted value. Accordingly, digital data corresponding to the signal level is obtained. When a predetermined period elapses, the controller 20 stops supply of control data to the reference signal generator 19 and output of the phase signals from the clock generator 18. Accordingly, the reference signal generator 19 stops generation of the reference signal.

The digital data corresponding to the reset level and the digital data corresponding to the signal level are transmitted to the output section 17 via the horizontal signal lines by the horizontal selector 14. By causing the output section 17 to perform an encoding process and a subtraction process (CDS process) based on the digital data, digital data of a signal component is obtained. The output section 17 may be built in the column processor 15.

Figure 2:
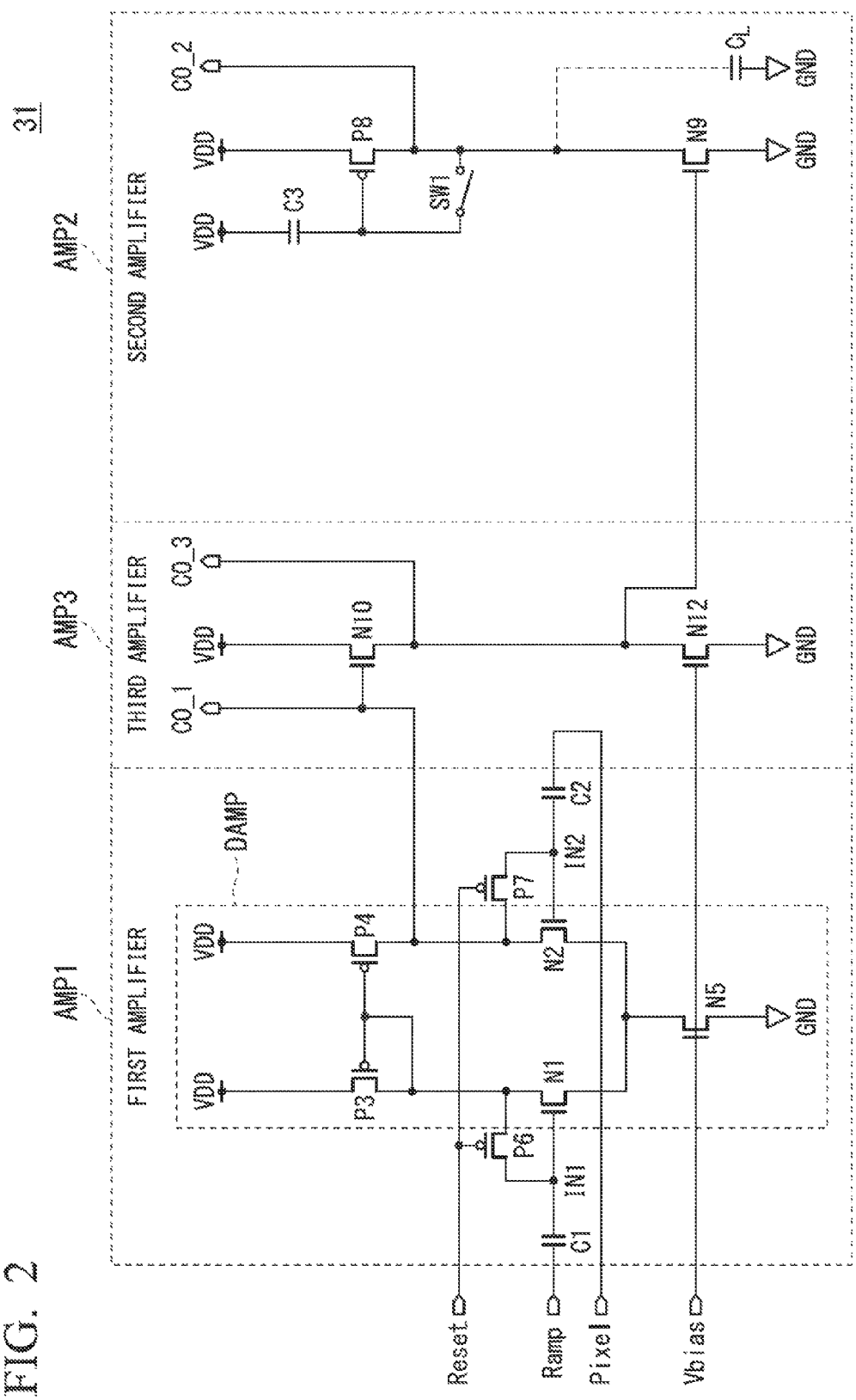
FIG. 2 is a circuit diagram illustrating a constitution of a comparator of the imaging device according to the first embodiment of the present invention.

The detailed constitution of the comparator 31 will be described below. FIG. 2 illustrates an example of the constitution of the comparator 31. The comparator 31 includes a first amplifier section AMP1, a second amplifier section AMP2, and a third amplifier section AMP3. The constitution of the comparator 31 will be described below using a voltage source VDD and a ground GND as an example of a voltage source.

The first amplifier section AMP1 includes a differential amplifier DAMP, transistors P6 and P7, and capacitive elements C1 and C2. The differential amplifier DAMP includes N-type transistors N1 and N2 constituted by NMOS transistors of which the sources are connected in common, P-type transistors P3 and P4 constituted by PMOS transistors which are connected between the drains of the transistors N1 and N2 and in which the voltage source VDD and the gates are connected in common, and a current source N5 constituted by an NMOS transistor which is connected between a node connected in common to the sources of the transistors N1 and N2 and the ground GND. The differential amplifier DAMP includes a first input terminal IN1 (the gate of the transistor N1) which is electrically connected to the reference signal generator 19 and a second input terminal IN2 (the gate of the transistor N2) which is electrically connected to the unit pixels 3 and compares the voltages of the first input terminal IN1 and the second input terminal IN2.

P-type transistors P6 and P7 constituted by PMOS transistors are connected between the gates and the drains of the transistors N1 and N2. The transistors P6 and P7 are changed to the ON state by supplying a low-active reset pulse Reset to the gates from the controller 20, and short-circuit the gates and the drains of the transistors N1 and N2. Accordingly, the transistors P6 and P7 serve as a reset unit that resets (initializes) the voltages of the gates of the transistors N1 and N2, that is, the voltages of the two input terminals of the differential amplifier DAMP. By resetting the voltages of two input terminals of the differential amplifier DAMP, an operating point of the differential amplifier DAMP at the time of starting the comparing process is determined.

The gates of the transistors N1 and N2, that is, the first input terminal IN1 and the second input terminal IN2 of the differential amplifier DAMP, are connected to the first terminals of the capacitive elements C1 and C2 for cutting a DC level and sampling a predetermined voltage at the time of reset. The second terminal of the capacitive element C1 is electrically connected to the reference signal generator 19 and is supplied with the reference signal Ramp from the reference signal generator 19. The second terminal of the capacitive element C2 is electrically connected to the unit pixels 3 of the imaging section 2 and is supplied with the pixel signal Pixel output from the unit pixels 3. The gate of the current source N5 is supplied with a bias voltage Vbias for controlling a current value.

The drain of the transistor N1 is connected to the drain and the gate of the transistor P3, and the source of the transistor P3 is connected to the voltage source VDD. The drain of the transistor N2 is connected to the drain of the transistor P4, and the source of the transistor P4 is connected to the voltage source VDD. The drain of the transistor N2 is also connected to the third amplifier section AMP3.

In the first amplifier section AMP1 having the above-mentioned constitution, the differential amplifier DAMP includes the transistor N1 (the first transistor) to the gate of which the reference signal Ramp is input and the transistor N2 (the second transistor) to the gate of which the pixel signal Pixel is input, outputs a standard signal from the drain of the transistor N2 at the time of initializing the voltages of the gate of the transistor N1 and the gate of the transistor N2, and outputs a first comparison signal CO_1 based on the comparison result of the reference signal Ramp and the pixel signal Pixel from the drain of the transistor N2 at the time of performing the comparing process.

In the first amplifier section AMP1, the transistor P6 (the first switching element) connects the gate and the drain of the transistor N1 at the time of initialization and disconnects (maintains the disconnected state of) the gate and the drain of the transistor N1 at the time of performing the comparing process. The transistor P7 (the second switching element) connects the gate and the drain of the transistor N2 at the time of initialization and disconnects (maintains the disconnected state of) the gate and the drain of the transistor N2 at the time of performing the comparing process. The capacitive element C1 (the second capacitive element) has the first terminal connected to the gate of the transistor N1 and the second terminal to which the reference signal Ramp is input and samples the voltage of the drain of the transistor N1 at the time of initialization. The capacitive element C2 (the third capacitive element) has the first terminal connected to the gate of the transistor N2 and the second terminal to which the pixel signal Pixel is input and samples the voltage of the drain of the transistor N2 at the time of initialization. The detailed operation of the first amplifier section AMP1 will be described later.

The third amplifier section AMP3 includes N-type transistors N10 and N12 constituted by an NMOS transistor having the same conductivity type as the transistors N1 and N2 constituting the differential amplifier DAMP. The gate of the transistor N10 (the fourth transistor) is connected to the drain of the transistor N2 and the drain of the transistor P4, and the drain of the transistor N10 is connected to the voltage source VDD. The drain of the transistor N12 (the fifth transistor) is connected to the source of the transistor N10 and the source of the transistor N12 is connected to the ground GND. The drain of the transistor N12 is also connected to the second amplifier section AMP2. The gate of the transistor N12 is supplied with the bias voltage Vbias for controlling a current value.

The transistors N10 and N12 constitute a source follower type level shift circuit. The standard signal output from the drain of the transistor N2 is input to the gate of the transistor N10 at the time of initialization, and the first comparison signal CO_1 output from the drain of the transistor N2 is input to the gate of the transistor N10 at the time of performing the comparing process. At the time of initialization, the transistor N10 shifts the level of the standard signal input to the gate thereof and outputs the level-shifted standard signal from the source thereof. At the time of performing the comparing process, the transistor N10 shifts the level of the first comparison signal CO_1 input to the gate thereof and outputs a level-shifted third comparison signal CO_3 from the source thereof. The detailed operation of the third amplifier section AMP3 will be described later.

The second amplifier section AMP2 includes an N-type transistor N9 (the sixth transistor) constituted by an NMOS transistor having the same conductivity type as the transistors N1 and N2 constituting the differential amplifier DAMP, a P-type transistor P8 (the third transistor) constituted by a PMOS transistor having a conductivity type other than that of the transistors N1 and N2, a capacitive element C3 (the first capacitive element), and a switching element SW1 (the third switching element). The gate of the transistor N9 is connected to the source of the transistor N10 and the drain of the transistor N12, the drain of the transistor N9 is connected to the drain of the transistor P8, and the source of the transistor N9 is connected to the ground GND. The source of the transistor P8 is connected to the voltage source VDD. The first terminal of the switching element SW1 is connected to the drain of the transistor N9 and the drain of the transistor P8, and the second terminal of the switching element SW1 is connected to the gate of the transistor P8. The first terminal of the capacitive element C3 is connected to the gate of the transistor P8 and the second terminal of the switching element SW1, and the second terminal of the capacitive element C3 is connected to the voltage source VDD. In FIG. 2, an output load $C_L$ including input capacitance and parasitic capacitance of a circuit in a subsequent stage of the comparator 31 or the like is illustrated.

In the second amplifier section AMP2 having the above-mentioned constitution, the switching element SW connects the drain of the transistor P8 and the first terminal of the capacitive element C3 at the time of initialization, and disconnects (maintains the disconnected state of) the drain of the transistor P8 and the first terminal of the capacitive element C3 at the time of performing the comparing process. A signal (the standard signal and the third comparison signal CO_3) output from the junction point (the source of the transistor N10 and the drain of the transistor N12) of the transistor N10 and the transistor N12 is input to the gate of the transistor N9. The capacitive element C3 samples the standard voltage (the voltage of the drain of the transistor N9) based on the standard signal input to the gate of the transistor N9 at the time of initialization, and outputs the standard voltage to the first terminal at the time of performing the comparing process.

The transistor P8 outputs a current based on the standard voltage input to the gate thereof from the drain thereof at the time of performing the comparing process. Accordingly, the comparator 31 (the second amplifier section AMP2) outputs a second comparison signal CO_2 based on the current flowing in the transistor P8 from the junction point of the transistor P8 and the transistor N9 (the drain of the transistor P8 and the drain of the transistor N9) after the second timing at which the state of the first comparison signal CO_1 or a signal (the third comparison signal CO_3) based on the first comparison signal CO_1 varies. The detailed operation of the second amplifier section AMP2 will be described later.

The operation of the comparator 31 will be described below. In the first reading of reading the pixel signal of the reset level and the second reading of reading the pixel signal of the signal level, the comparator 31 operates as follows.

(Operation at the Time of Initialization)

After a pixel signal Pixel from a unit pixel 3 is supplied to the second input terminal IN2 of the differential amplifier DAMP and the reference signal Ramp supplied to the first input terminal IN1 of the differential amplifier DAMP from the reference signal generator 19 is stabilized and before the comparator 31 starts the comparing process, the controller 20 activates (low-activates) a reset pulse Reset. Accordingly, the transistors P6 and P7 are changed to the ON state and short-circuit the gates and the drains of the transistors N1 and N2, and the voltages of two input terminals are reset using the operating points of the transistors N1 and N2 as a drain voltage.

At the operating point which is determined by this resetting (initialization), offset components of the voltages of two input terminals of the differential amplifier DAMP, that is, the voltages of the gates of the transistors N1 and N2, are almost cancelled. That is, the voltages of the two input terminals of the differential amplifier DAMP are reset to be substantially the same voltage.

Figure 3:
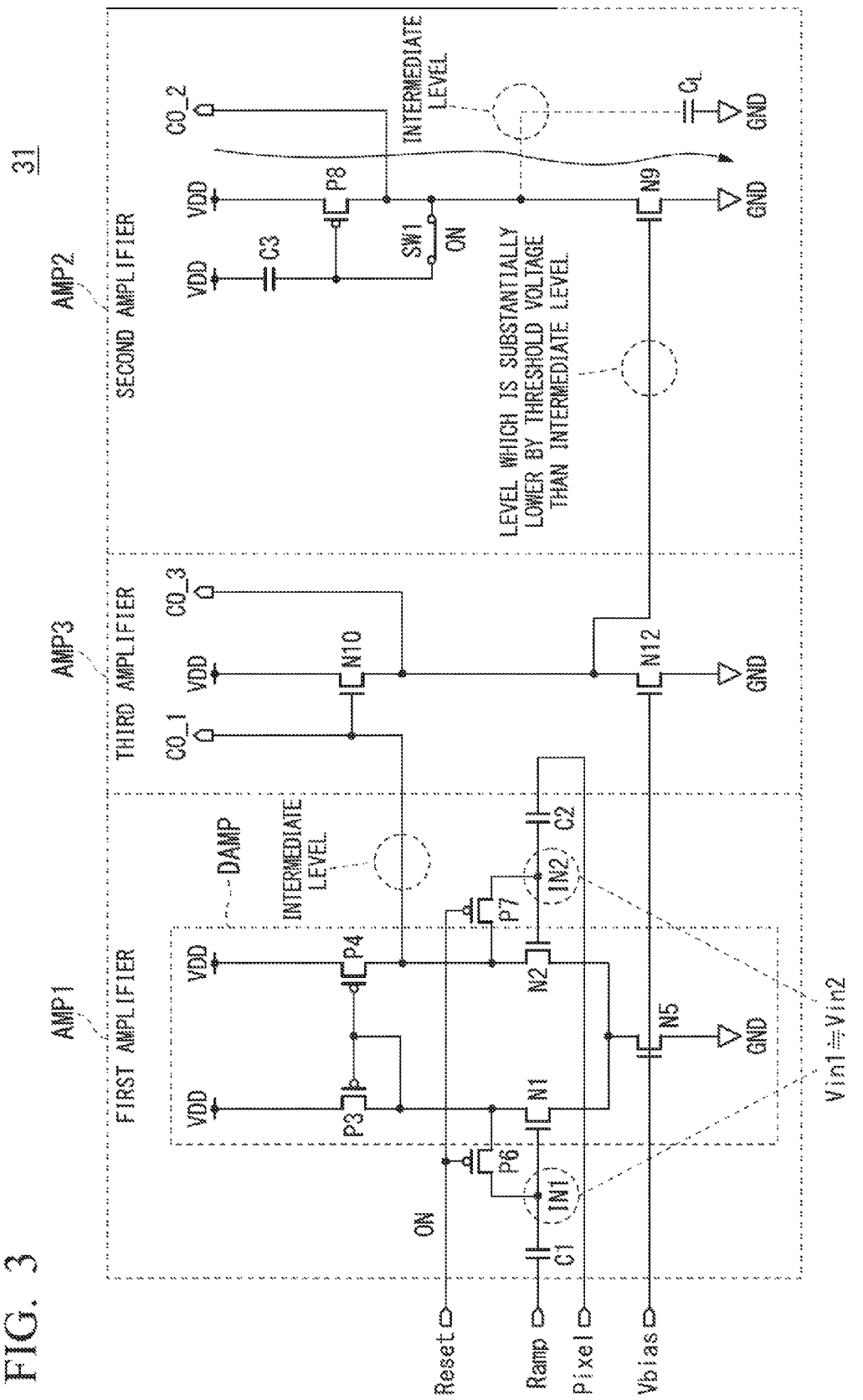
FIG. 3 is a circuit diagram illustrating an operation of the comparator of the imaging device according to the first embodiment of the present invention.

FIG. 3 illustrates a state of the comparator 31 at the time of initialization. When the transistors P6 and P7 are in the ON state, the voltage Vin1 of the first input terminal IN1 of the differential amplifier DAMP and the voltage Vin2 of the second input terminal IN2 of the differential amplifier DAMP are substantially equal to each other. Accordingly, a current flowing between the drain and the source of the transistor N1 and a current flowing between the drain and the source of the transistor N2 are substantially equal to each other. At this time, the transistor N2 outputs the standard signal from the drain thereof. At this time, the voltage of the drain of the transistor N2 is a voltage equal to or higher than the threshold voltage (Vth) required for turning on the transistor N10 and has an intermediate level which is a voltage lower than the H level.

The standard signal output from the drain of the transistor N2 is input to the gate of the transistor N10. Since the voltage of the gate of the transistor N10 has the intermediate level, the transistor N10 is changed to the ON state and a current flows between the drain and the source of the transistor N10. At this time, the voltage of the source of the transistor N10 has a level which is lower by the threshold voltage of the transistor N10 than the voltage (the intermediate level) of the gate of the transistor N10. That is, the transistor N10 shifts the level of the standard signal input to the gate thereof by the threshold voltage of the transistor N10 and outputs the level-shifted standard signal from the source thereof.

The standard signal output from the source of the transistor N10 is input to the gate of the transistor N9. At this time, the voltage of the gate of the transistor N9 is changed to a level which is lower by the threshold voltage of the transistor N10 than the intermediate level. The currents flowing in the transistor N10 and N12 are limited by the bias voltage Vbias supplied to the gate of the transistor N12 and are sufficiently smaller than the penetrating current flowing in the inverter circuit.

The standard signal output from the junction point of the transistor N10 and the transistor N12 (the source of the transistor N10 and the drain of the transistor N12) is input to the gate of the transistor N9. Since the voltage of the gate of the transistor N9 has a level which is lower by the threshold voltage of the transistor N10 than the intermediate level, the transistor N9 is in the ON state and a current flows between the drain and the source of the transistor N9.

At the time of initialization, the switching element SW1 is changed to the ON state and connects the drain of the transistor P8 and the first terminal of the capacitive element C3. Accordingly, the voltage of the gate of the transistor P8 is substantially equal to the voltage of the drain of the transistor P8. This voltage is a voltage higher than the L level and has an intermediate level which is lower than a voltage lower by the threshold voltage of the transistor P8 than the source voltage VDD. Since the voltage of the gate of the transistor P8 has the intermediate level, the transistor P8 is changed to the ON state and a current flows between the source and the drain of the transistor P8.

At this time, in the second amplifier section AMP2, a current flows in a path passing through the transistor P8 and the transistor N9 from the voltage source VDD to the ground GND. This current is limited by the voltage supplied to the gate of the transistor N9 and is sufficiently smaller than the penetrating current flowing in the inverter circuit. The voltage of the drain of the transistor P8, that is, the voltage of the second comparison signal CO_2, has an intermediate level.

The capacitive element C3 samples the standard voltage (the voltage of the drain of the transistor N9) based on the standard signal input to the gate of the transistor N9. After the initialization ends, the transistors P6 and P7 are changed to the OFF state and disconnect the gates and the drains of the transistors N1 and N2. After the initialization ends, the switching element SW1 is changed to the OFF state and disconnects the drain of the transistor P8 and the first terminal of the capacitive element C3. Thereafter, until the comparing process ends, the switching element SW1 is maintained in the OFF state.

(Operation when Voltage of Reference Signal Ramp≥Voltage of Pixel Signal Pixel)

Figure 4:
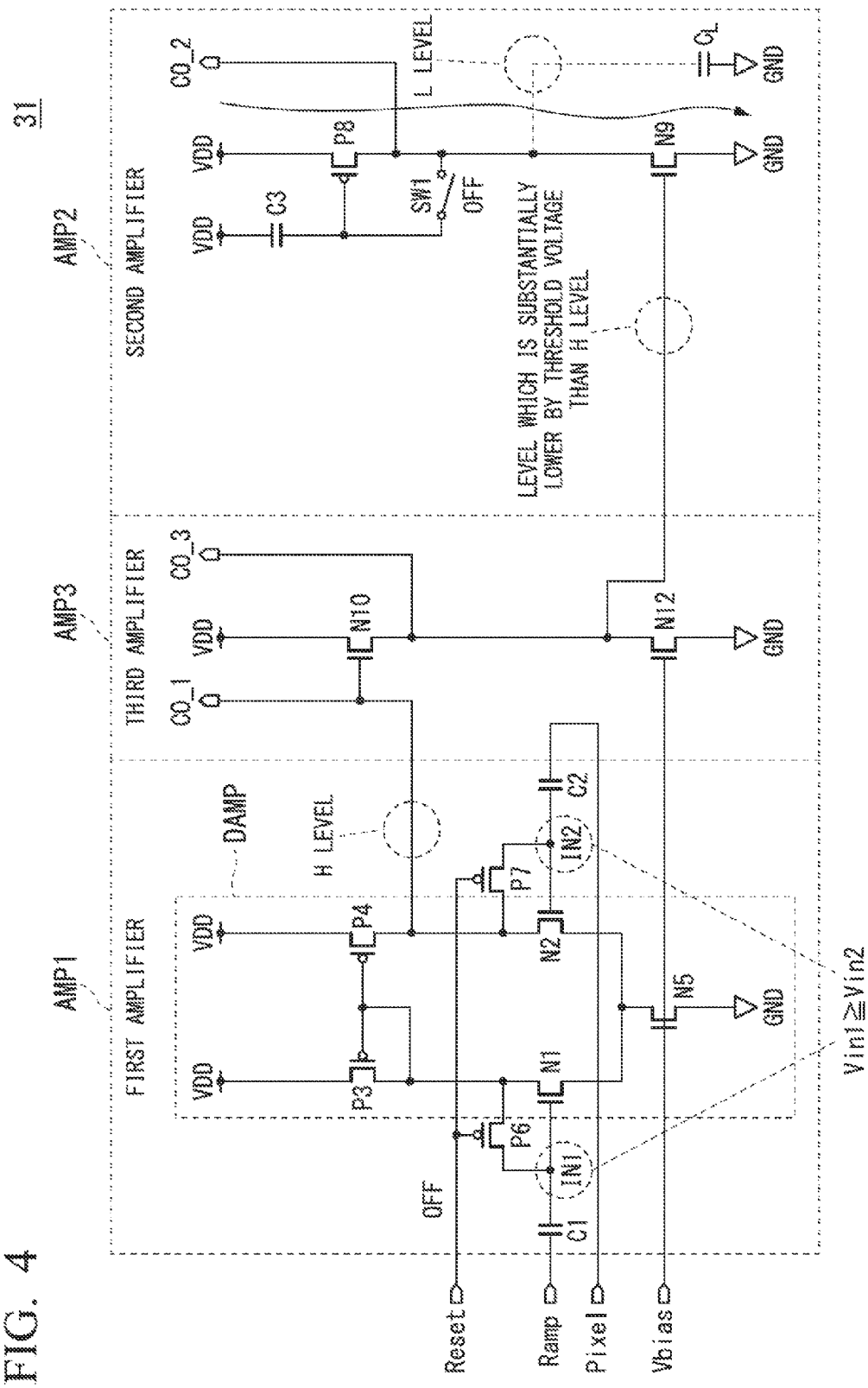
FIG. 4 is a circuit diagram illustrating an operation of the comparator of the imaging device according to the first embodiment of the present invention.

After the reference signal Ramp is supplied to the first input terminal IN1 of the differential amplifier DAMP and the voltage Vin1 of the first input terminal IN1 of the differential amplifier DAMP increases, the comparing process is started and the voltage of the reference signal Ramp decreases in a ramp shape. FIG. 4 illustrates a state of the comparator 31 until the voltage of the reference signal Ramp decreases and the voltage of the reference signal Ramp is substantially equal to the voltage of the pixel signal Pixel after the initialization ends and the voltage of the reference signal Ramp becomes higher than the voltage of the pixel signal Pixel.

When the voltage of the reference signal Ramp is higher than the voltage of the pixel signal Pixel, the voltage of the first input terminal IN1 of the differential amplifier DAMP is higher than the voltage of the second input terminal IN2 of the differential amplifier DAMP. In this case, the transistor N2 is in the OFF state and the voltage of the drain of the transistor N2 has the H level. That is, at the time of performing the comparing process, the transistor N2 outputs the first comparison signal CO_1 of the H level corresponding to the comparison result of the reference signal Ramp and the pixel signal Pixel from the drain thereof.

The first comparison signal CO_1 output from the drain of the transistor N2 is input to the gate of the transistor N10. Since the voltage of the gate of the transistor N10 is changed to the H level, the transistor N10 is changed to the ON state and a current flows between the drain and the source of the transistor N10. At this time, the voltage of the source of the transistor N10 has a level which is lower by the threshold voltage of the transistor N10 than the voltage (the H level) of the gate of the transistor N10. That is, the third amplifier section AMP3 shifts the level of the first comparison signal CO_1 input to the gate of the transistor N10 by the threshold voltage of the transistor N10 and outputs the level-shifted third comparison signal CO_3 from the source of the transistor N10.

The third comparison signal CO_3 output from the source of the transistor N10 is input to the gate of the transistor N9. At this time, the voltage of the gate of the transistor N9 has a level which is lower by the threshold voltage of the transistor N10 than the H level. The currents flowing in the transistors N10 and N12 are limited by the bias voltage Vbias supplied to the gate of the transistor N12 and are sufficiently smaller than the penetrating current flowing in the inverter circuit.

The capacitive element C3 outputs the standard voltage sampled at the time of initialization from the first terminal thereof. The transistor P8 is changed to the ON state by the standard voltage input to the gate thereof and outputs a current based on the standard voltage from the drain thereof. That is, the transistor P8 serves as a current source (a constant current source) at the time of performing the comparing process. At this time, the standard voltage input to the gate of the transistor P8 is a voltage which is higher than the L level and lower than a voltage which is lower by the threshold voltage of the transistor P8 than the source voltage VDD.

The third comparison signal CO_3 output from the junction point of the transistor N10 and the transistor N12 (the source of the transistor N10 and the drain of the transistor N12) is input to the gate of the transistor N9. Since the voltage of the gate of the transistor N9 has a level which is lower by the threshold voltage of the transistor N10 than the H level, the transistor N9 is changed to the ON state and a current flows between the drain and the source of the transistor N9. The current flowing in the transistor N9 is supplied from the transistor P8.

At this time, in the second amplifier section AMP2, a current flows in a path passing through the transistor P8 and the transistor N9 from the voltage source VDD to the ground GND. This current is limited by the standard voltage supplied to the gate of the transistor P8 and is sufficiently smaller than the penetrating current flowing in the inverter circuit. The ON resistance of the transistor N9 is lower than the ON resistance at the time of initialization and the voltage of the drain of the transistor P8, that is, the voltage of the second comparison signal CO_2, is changed to the L level.

(Operation when Voltage of Reference Signal Ramp≤Voltage of Pixel Signal Pixel)

Figure 5:
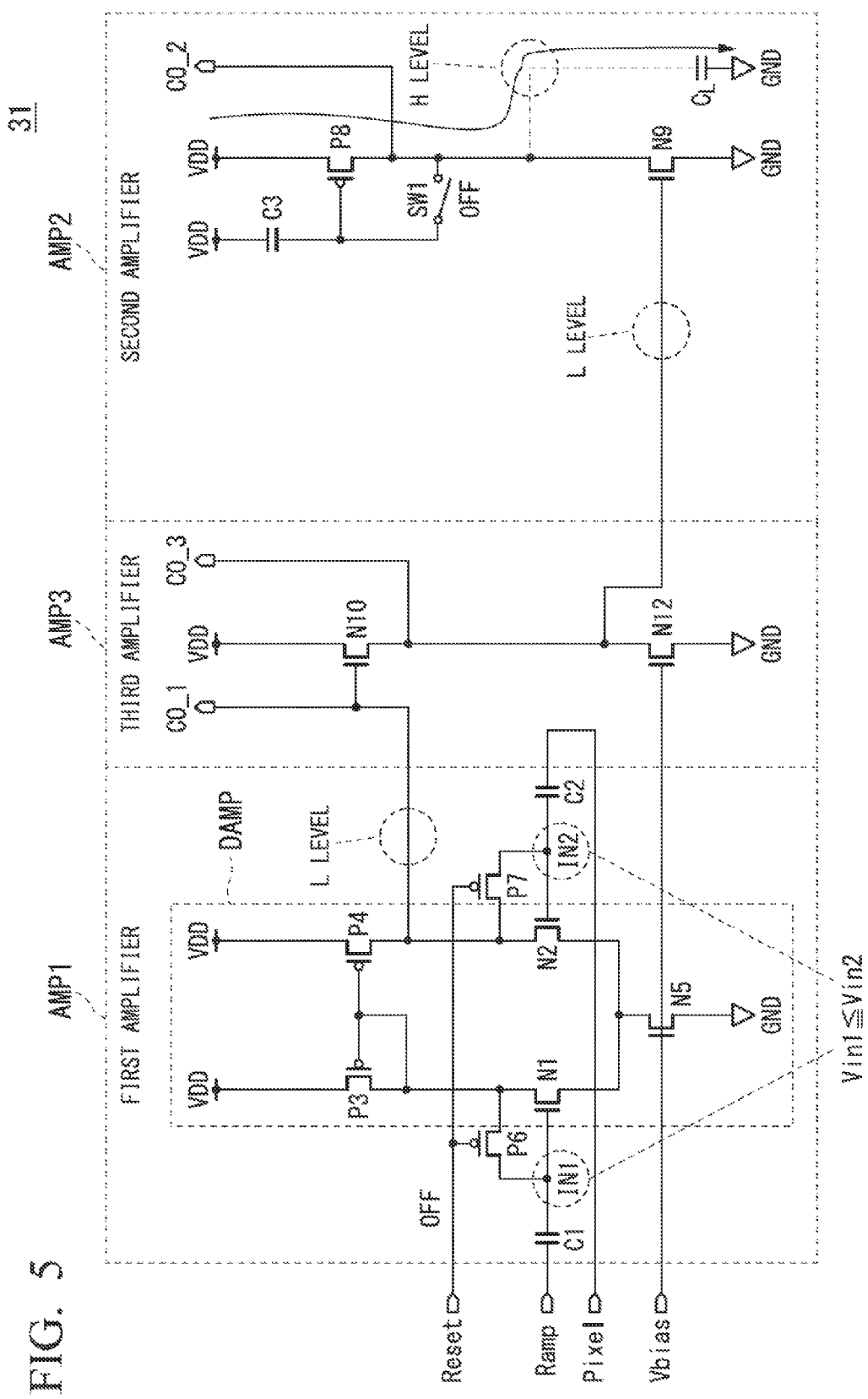
FIG. 5 is a circuit diagram illustrating an operation of the comparator of the imaging device according to the first embodiment of the present invention.

The voltage of the reference signal Ramp additionally decreases and the voltage of the reference signal Ramp becomes substantially equal to the voltage of the pixel signal Pixel (the second timing). Thereafter, the voltage of the reference signal Ramp becomes lower than the voltage of the pixel signal Pixel. FIG. 5 illustrates a state of the comparator 31 after the voltage of the reference signal Ramp decreases and the voltage of the reference signal Ramp becomes substantially equal to the voltage of the pixel signal Pixel.

When the voltage of the reference signal Ramp is lower than the voltage of the pixel signal Pixel, the voltage of the first input terminal IN1 of the differential amplifier DAMP is lower than the voltage of the second input terminal IN2 of the differential amplifier DAMP. In this case, since the transistor N1 is in the OFF state, a current does not flow between the drain and the source of the transistor N1, and the transistor N2 is in the ON state, the voltage of the drain of the transistor N2 has the L level. That is, at the time of performing the comparing process, the transistor N2 outputs the first comparison signal CO_1 of the L level corresponding to the comparison result of the reference signal Ramp and the pixel signal Pixel from the drain thereof.

The first comparison signal CO_1 output from the drain of the transistor N2 is input to the gate of the transistor N10. Since the voltage of the gate of the transistor N10 is changed to the L level, the transistor N10 is changed to the OFF state. At this time, the transistor N12 is in the ON state and the voltage of the drain of the transistor N12 has the L level. Accordingly, the transistor N12 outputs the third comparison signal CO_3 of the L level from the drain thereof. That is, the third amplifier section AMP3 shifts the level of the first comparison signal CO_1 input to the gate of the transistor N10 to the L level and outputs the level-shifted third comparison signal CO_3 from the drain of the transistor N12.

The third comparison signal CO_3 output from the drain of the transistor N12 is input to the gate of the transistor N9. At this time, the voltage of the gate of the transistor N9 has the L level. The current flowing in the transistor N12 is limited by the bias voltage Vbias supplied to the gate of the transistor N12 and is sufficiently smaller than the penetrating current flowing in the inverter circuit.

The transistor P8 is changed to the ON state by the standard voltage input to the gate thereof from the first terminal of the capacitive element C3 and outputs a current based on the standard voltage from the drain thereof. The standard voltage input to the gate of the transistor P8 is a voltage which is higher than the L, level and lower than a voltage which is lower by the threshold voltage of the transistor P8 than the source voltage VDD.

The third comparison signal CO_3 output from the junction point of the transistor N10 and the transistor N12 (the source of the transistor N10 and the drain of the transistor N12) is input to the gate of the transistor N9. Since the voltage of the gate of the transistor N9 has the L level, the transistor N9 is changed to the OFF state.

At this time, in the second amplifier section AMP2, a current flows in a path passing through the transistor P8 and the output load $C_L$ from the voltage source VDD to the ground GND. This current is substantially equal to the current flowing in the second amplifier section AMP2 when the voltage of the reference signal Ramp is higher than the voltage of the pixel signal Pixel. This current is limited by the standard voltage supplied to the gate of the transistor P8 and is sufficiently smaller than the penetrating current flowing in the inverter circuit. Since the transistor N9 is in the OFF state, the voltage of the drain of the transistor P8, that is, the voltage of the second comparison signal CO_2, is changed to the H level.

The latch controller 32 changes the latch circuits L_0 to L_6 of the latch section 33 to the enabled state at the second timing based on the first comparison signal CO_1 or the third comparison signal CO_3. That is, the latch controller 32 changes the latch circuits L_0 to L_6 of the latch section 33 at the second timing at which the voltage of the first comparison signal CO_1 is changed from the H level to the L level or at the second timing at which the voltage of the third comparison signal CO_3 is changed from a level lower by the threshold voltage of the transistor N10 than the H level to the L level. The latch controller 32 changes the latch circuits L_0 to L_7 of the latch section 33 to the disabled state at the third timing based on the second comparison signal CO_2.

The voltage of the output load $C_L$ has the L level immediately before the second timing. After the second timing, the current output from the transistor P8 charges the output load $C_L$ and thus the voltage $V_0$ of the output load $C_L$ is expressed by Equation (1).

$$V_0 = \frac{I_{const}}{C_L} \times t \qquad (1)$$

In Equation (1), $I_{const}$ denotes a current value (constant value) output from the transistor P8, $C_L$ denotes a capacitance value of the output load $C_L$, and t denotes a time. As expressed by Equation (1), the voltage $V_0$ of the output load $C_L$ linearly increases with a slope corresponding to the constant current value $I_{const}$. At a timing (the third timing) at which the voltage $V_0$ becomes higher than a circuit threshold value of the latch controller 32, the latch controller 32 causes the latch section 33 to perform a latching operation by changing the latch circuits L_0 to L_7 of the latch section 33 to the disabled state. That is, the latch controller 32 causes the latch section 33 to perform a latching operation at the third timing which is determined by the slope of the voltage variation of the second comparison signal CO_2 (the current value $I_{const}$ in Equation (1)) and the circuit threshold value of the latch controller 32 after the second timing.

When a bounce of the source voltage VDD occurs during the comparing process, the voltage of the second terminal of the capacitive element C3 connected to the voltage source VDD varies and the voltage of the first terminal of the capacitive element C3 varies with the variation. Accordingly, the standard voltage output from the first terminal of the capacitive element C3, that is, the voltage of the gate of the transistor P8, varies. Since the voltage of the source of the transistor P8 connected to the voltage source VDD also varies but the voltage of the gate of the transistor P8 varies with the variation, the variation of the voltage between the gate and the source of the transistor P8 is suppressed. That is, the variation of the current output from the drain of the transistor P8 is suppressed. As described above, the third timing is a timing based on the current output from the transistor P8. Accordingly, even when the source voltage VDD varies during the comparing process, it is possible to suppress a variation of the third timing.

The current flowing from the voltage source VDD to the ground GND in the second amplifier section AMP2 and the third amplifier section AMP3 is sufficiently smaller than the penetrating current flowing in the inverter circuit. Accordingly, it is possible to suppress a bounce of the source voltage VDD and the ground GND.

When a bounce of the source voltage VDD or the ground voltage GND occurs, the voltage of the output load $C_L$ varies. When the voltage of the output load $C_L$ varies due to the bounce of the source voltage VDD or the ground voltage GND, the time until the voltage of the output load $C_L$ reaches the circuit threshold value of a subsequent-stage circuit (the latch control circuit 32) varies and thus the third timing varies. As described above, in this embodiment, since occurrence of the bounce of the source voltage VDD and the ground voltage GND can be suppressed, it is possible to suppress a variation of the third timing.

In the constitution of the imaging device 1 according to this embodiment, the vertical selector 12, the horizontal selector 14, the output section 17, and the controller 20 are not characteristic elements of the tdcSS type AD conversion circuit. These elements are not essential for achieving the characteristic effects of the imaging device 1 according to this embodiment. The counter 34 is not essential for achieving the characteristic effects of the imaging device 1 according to this embodiment.

Modified Example

Figure 6:
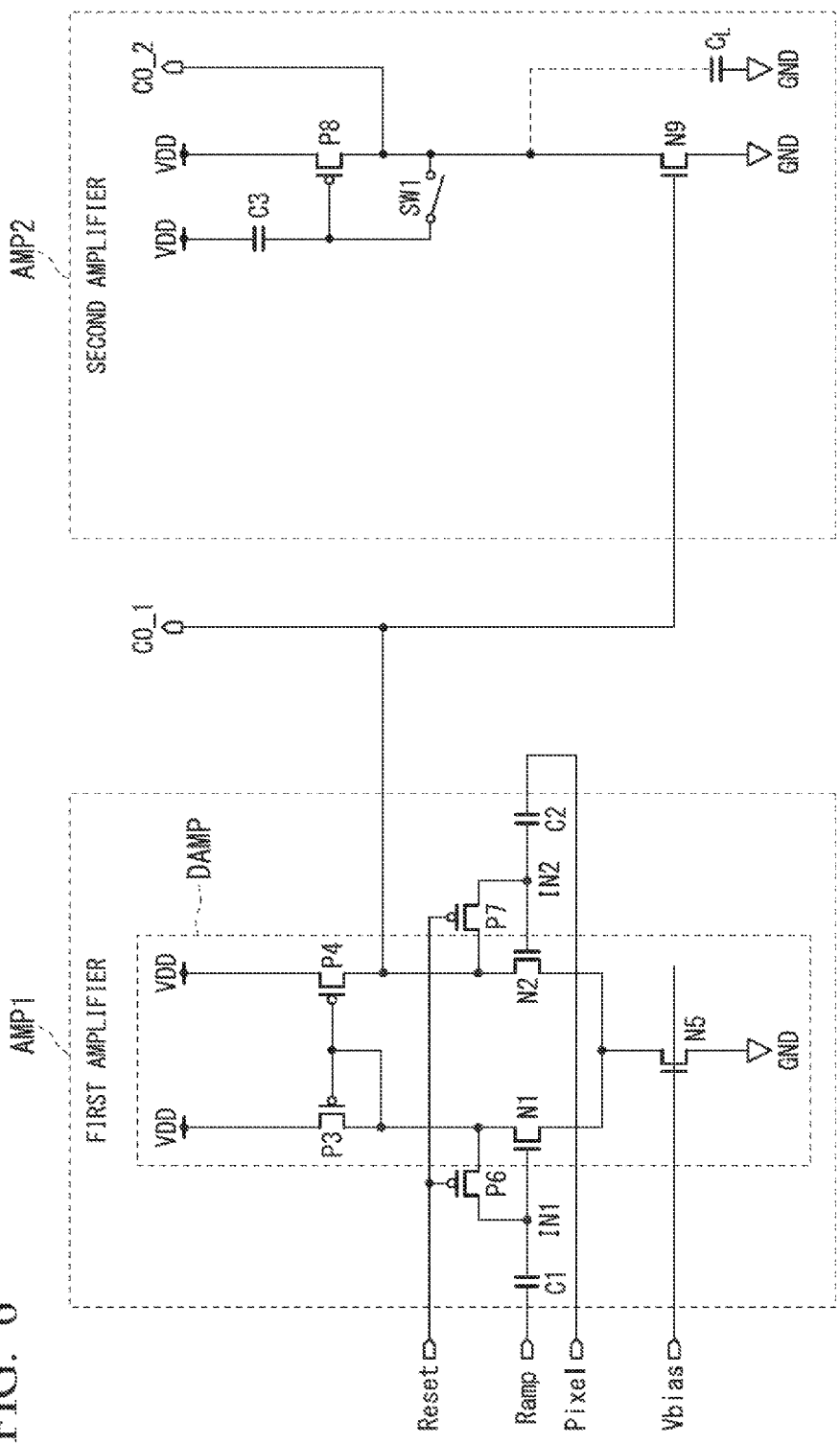
FIG. 6 is a circuit diagram illustrating a constitution of a comparator of the imaging device according to a modified example of the first embodiment of the present invention.

A modified example of this embodiment will be described below. In the modified example, the comparator 31 of the imaging device 1 illustrated in FIG. 1 is replaced with a comparator 31a illustrated in FIG. 6. FIG. 6 illustrates an example of a constitution of the comparator 31a according to this modified example.

In the comparator 31a, the third amplifier section AMP3 is removed from the comparator 31 illustrated in FIG. 2. The drain of the transistor N2 and the drain of the transistor P4 are connected to the gate of the transistor N9 (the fourth transistor). Other constitutions are identical to described above and description thereof will not be repeated.

The standard signal output from the drain of the transistor N2 and the comparison signal CO_1 are not shifted in level but are input to the gate of the transistor N9. Except for this point, the operation of the comparator 31a is substantially identical to the operation of the comparator 31.

In this modified example, the variation of the voltage between the gate and the source of the transistor P8 is suppressed by the operation of the capacitive element C3. Accordingly, the third amplifier section AMP3 in the comparator 31 illustrated in FIG. 2 is not essential for achieving the characteristic effects of the imaging device 1 according to this embodiment.

According to this embodiment, the imaging device 1 is constituted to include: the imaging section 2 in which a plurality of pixels (the unit pixels 3) each having a photoelectric conversion element are arranged in a matrix shape; the clock generator 18 that generates a plurality of phase signals having different phases; the reference signal generator 19 that generates a reference signal which increases or decreases with the lapse of time; the comparator 31 that is disposed to correspond to each column of an array of the plurality of pixels, starts a comparing process of comparing a pixel signal output from each pixel with the reference signal at a first timing, and ends the comparing process at a second timing at which the relationship between the reference signal and the pixel signal satisfies a predetermined condition; the latch section 33 that is disposed to correspond to the comparator 31 and latches logic states of the plurality of phase signals; and the latch controller 32 that is disposed to correspond to the comparator 31, activates the latch section 33 at the second timing, and causes the latch section 33 to perform a latching operation at a third timing at which a time based on a current output from the comparator 31 elapses from the second timing, and in which the comparator 31 includes the differential amplifier DAMP that includes the first transistor (the transistor N1) to the gate of which the reference signal is input and the second transistor (the transistor N2) to the gate of which the pixel signal is input, outputs a standard signal at the time of initializing voltages of the gate of the first transistor and the gate of the second transistor, and outputs a first comparison signal CO_1 corresponding to the comparison result of the reference signal and the pixel signal at the time of performing the comparing process, the third transistor (the transistor P8) that has a source connected to a voltage source (the voltage source VDD) and outputs a current at the time of performing the comparing process, and the first capacitive element (the capacitive element C3) that has a first terminal connected to the gate of the third transistor and a second terminal connected to the voltage source, samples a standard voltage based on the standard signal, and outputs the standard voltage to the first terminal at the time of performing the comparing process, and a second comparison signal CO_2 based on a current flowing in the third transistor is output after the second timing at which the state of the first comparison signal CO_1 or a signal (the third comparison signal CO_3) based on the first comparison signal CO_1 is changed.

In this embodiment, even when a bounce of the source voltage VDD occurs at the time of performing the comparing process, the standard voltage of the first terminal of the capacitive element C3 varies with the bounce and thus the variation of the voltage between the gate and the source of the transistor P8 of which the source is connected to the voltage source VDD is suppressed. Accordingly, since the variation of the current flowing in the transistor P8 is suppressed, it is possible to suppress the variation of the third timing due to the bounce of the source voltage VDD. As a result, it is possible to reduce deterioration of AD conversion accuracy.

By causing the capacitive element C3 to sample the standard voltage at the time of initialization and causing the capacitive element C3 to output the standard voltage at the time of performing the comparing process, it is possible to make a voltage source for determining the standard voltage unnecessary.

By constituting the comparator 31 as illustrated in FIG. 2, it is possible to simplify the circuit constitution of the comparator 31.

By constituting the latch controller 32 to activate (enabled state) the latch section 33 at the second timing based on the first comparison signal CO_1 or the third comparison signal CO_3 based on the first comparison signal CO_1, it is possible to simplify the circuit constitution of the latch controller 32.

Second Embodiment

Figure 7:
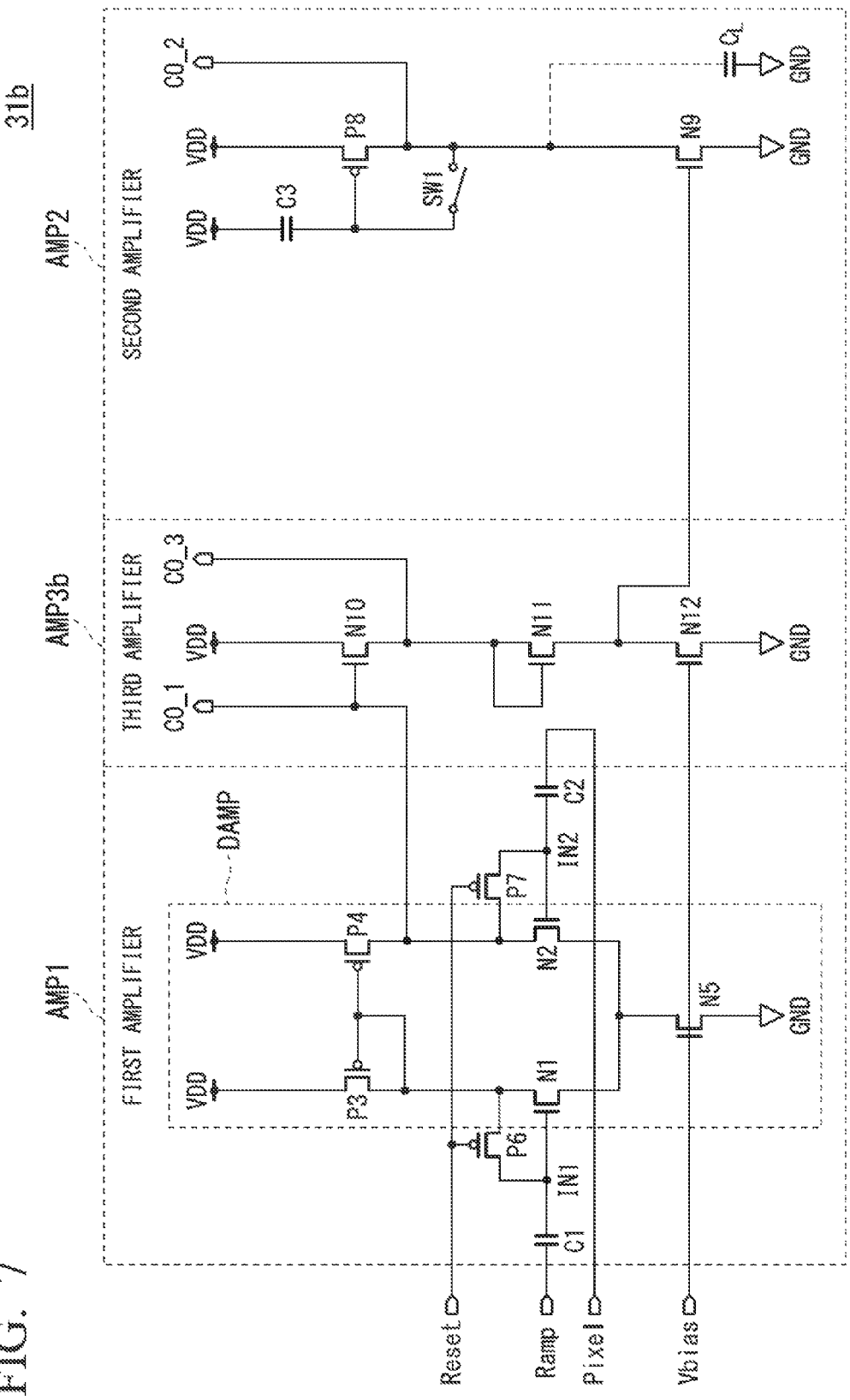
FIG. 7 is a circuit diagram illustrating a constitution of a comparator of an imaging device according to a second embodiment of the present invention.

A second embodiment of the present invention will be described below. In this embodiment, the comparator 31 of the imaging device 1 illustrated in FIG. 1 is replaced with a comparator 31b illustrated in FIG. 7. FIG. 7 illustrates an example of a constitution of the comparator 31b according to this embodiment.

In the comparator 31b, the third amplifier section AMP3 of the comparator 31 is replaced with a third amplifier section AMP3b. In the third amplifier section AMP3b, an N-type transistor N11 constituted by an NMOS transistor is connected between the transistor N10 and the transistor N12. The gate and the drain of the transistor N11 are connected to the source of the transistor N10. The drain of the transistor N12 is connected to the source of the transistor N11. Other constitutions are identical to described above and description thereof will not be repeated.

The transistor N11 is disposed to adjust a degree of level shift of the standard signal and the first comparison signal CO_1 which are input to the gate of the transistor N10. Since a voltage drop occurs in the transistor N11 due to a current flowing in the transistor N11, the voltage of the gate of the transistor N9 decreases. Accordingly, the current flowing in the transistor N9 at the time of initialization decreases. Since the current flowing in the transistor N9 decreases, the current flowing in the transistor P8 decreases and the standard voltage sampled by the capacitive element C3 at the time of initialization becomes higher than the standard voltage in the first embodiment. Accordingly, the voltage between the gate and the source of the transistor P8 at the time of performing the comparing process becomes lower than the voltage in the first embodiment and the current flowing in the second amplifier section AMP2 becomes smaller. Accordingly, it is possible to suppress bounces of the source voltage VDD and the ground voltage GND. As a result, it is possible to reduce deterioration in AD conversion accuracy. It is possible to realize a constitution for controlling the current flowing in the second amplifier section AMP2 with a simple constitution.

Third Embodiment

Figure 8:
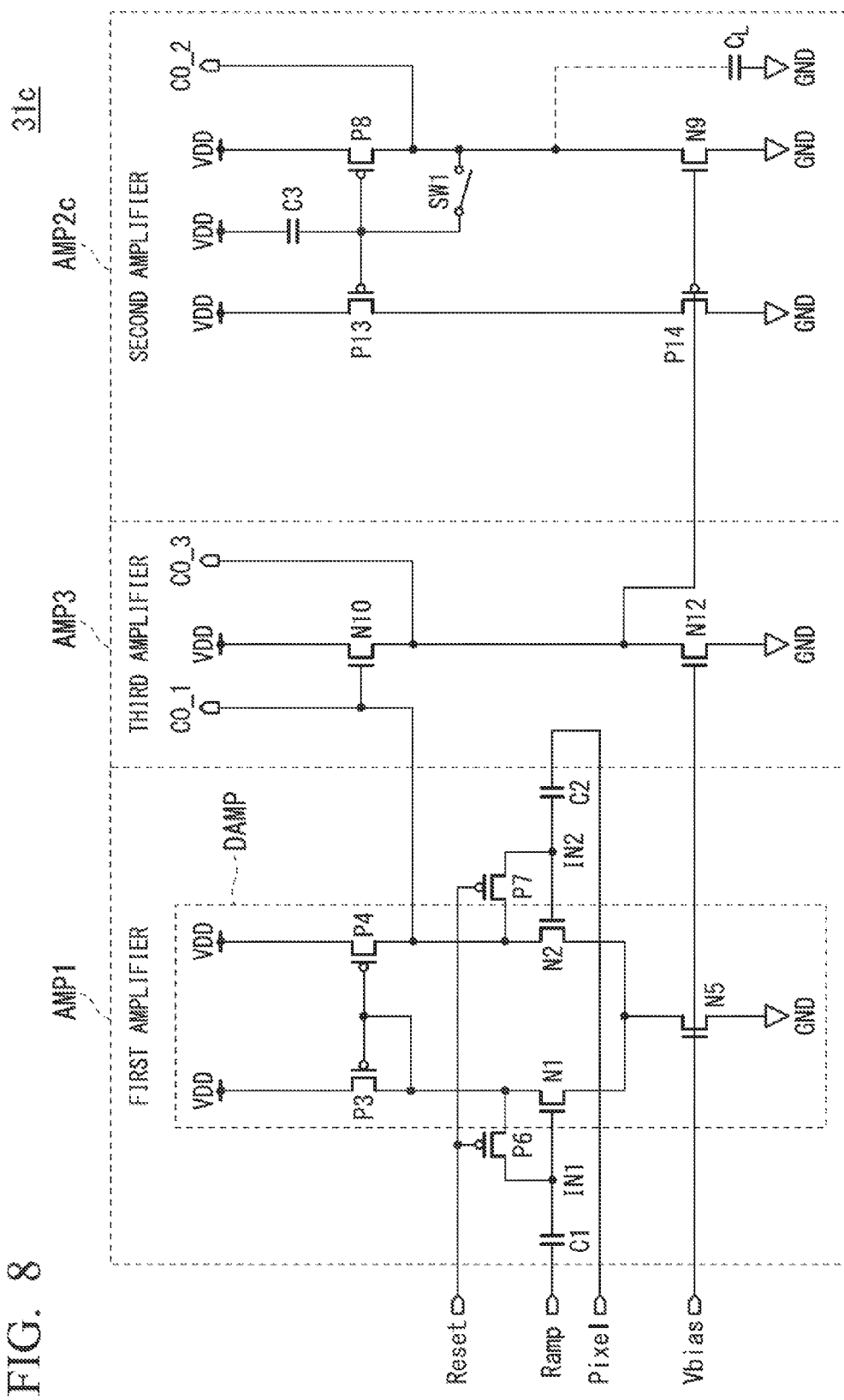
FIG. 8 is a circuit diagram illustrating a constitution of a comparator of an imaging device according to a third embodiment of the present invention.

A third embodiment of the present invention will be described below. In this embodiment, the comparator 31 of the imaging device 1 illustrated in FIG. 1 is replaced with a comparator 31c illustrated in FIG. 8. FIG. 8 illustrates an example of a constitution of the comparator 31c according to this embodiment.

In the comparator 31c, the second amplifier section AMP2 of the comparator 31 is replaced with a second amplifier section AMP2c. In the second amplifier section AMP2c, P-type transistors P13 and P14 constituted by PMOS transistors are added to the second amplifier section AMP2. The gate of the transistor P13 is connected to the gate of the transistor P8, the first terminal of the capacitive element C3, and the second terminal of the switching element SW1. The source of the transistor P13 is connected to the voltage source VDD. The gate of the transistor P14 is connected to the source of the transistor N10 and the drain of the transistor N12, the source of the transistor P14 is connected to the drain of the transistor P13, and the drain of the transistor P14 is connected to the ground GND. Other constitutions are identical to described above and description thereof will not be repeated.

The transistor P13 outputs a current based on the standard voltage, which is output from the first terminal of the capacitive element C3 at the time of performing the comparing process, from the drain thereof. The transistor P14 outputs the current output from the drain of the transistor P13 at the time of performing the comparing process to the ground GND.

The operation of the comparator 31c will be described below. The operation at the time of initialization is identical to described above and description thereof will not be repeated.

(Operation when Voltage of Reference Signal Ramp≥Voltage of Pixel Signal Pixel)

After the reference signal Ramp is supplied to the first input terminal IN1 of the differential amplifier DAMP and the voltage Vin1 of the first input terminal IN1 of the differential amplifier DAMP increases, the comparing process is started and the voltage of the reference signal Ramp decreases in a ramp shape.

As described above, the voltage of the source of the transistor N10 has a level which is lower by the threshold voltage of the transistor N10 than the voltage (the H level) of the gate of the transistor N10. Accordingly, the voltage of the gate of the transistor P14 connected to the source of the transistor N10 has a level which is lower by the threshold voltage of the transistor N10 than the H level. At this time, since the transistor P14 is in the OFF state, a current does not flow in the transistors P13 and P14.

(Operation when Voltage of Reference Signal Ramp≤Voltage of Pixel Signal Pixel)

The voltage of the reference signal Ramp additionally decreases and the voltage of the reference signal Ramp becomes substantially equal to the voltage of the pixel signal Pixel (the second timing). Thereafter, the voltage of the reference signal Ramp becomes lower than the voltage of the pixel signal Pixel.

As described above, the voltage of the drain of the transistor N12 has the L level. Accordingly, the transistor P14 is in the ON state. The transistor P13 is changed to the ON state by the standard voltage input to the gate thereof from the first terminal of the capacitive element C3, and outputs a current based on the standard voltage from the drain thereof. The current output from the transistor P13 is guided to the transistor P14.

At the time of performing the comparing process, in the second amplifier section AMP2c, a current flows in a path passing through the transistor P8 and the transistor N9 from the voltage source VDD to the ground GND until the second timing. After the second timing, in the second amplifier section AMP2c, a current flows in a path passing through the transistor P8 and the output load $C_L$ from the voltage source VDD to the ground GND. When the output load $C_L$ is charged, the current does not flow and thus a current does not flow in the path passing through the transistor P8 and the transistor N9 from the voltage source VDD to the ground GND.

On the other hand, after the second timing, in the second amplifier section AMP2c, a current flows in a path passing through the transistor P13 and the transistor P14 from the voltage source VDD to the ground GND. Accordingly, after the second timing, it is possible to compensate for a current by the current not flowing in the path passing through the transistor P8 and the transistor N9 and to suppress a variation of the current in the second amplifier section AMP2c before and after the second timing. As a result, in this embodiment, it is possible to suppress occurrence of bounce of the source voltage VDD and the ground voltage GND and to reduce deterioration in AD conversion accuracy.

The transistors P13 and P14 of this embodiment may be added to the comparator 31b illustrated in FIG. 7.

Fourth Embodiment

Figure 9:
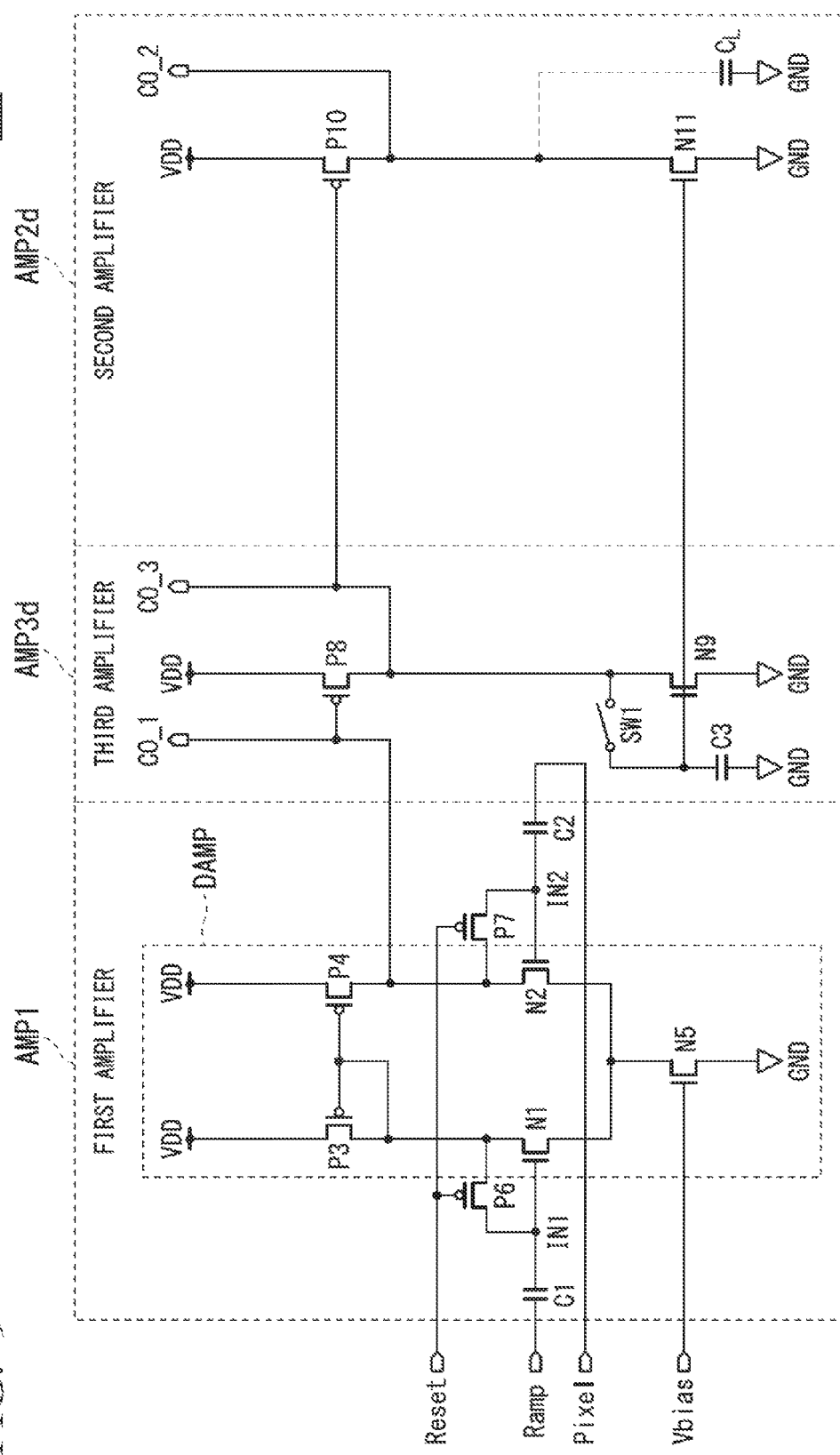
FIG. 9 is a circuit diagram illustrating a constitution of a comparator of an imaging device according to a fourth embodiment of the present invention.

A fourth embodiment of the present invention will be described below. In this embodiment, the comparator 31 of the imaging device 1 illustrated in FIG. 1 is replaced with a comparator 31d illustrated in FIG. 9. FIG. 9 illustrates an example of a constitution of the comparator 31d according to this embodiment.

In the comparator 31d, the second amplifier section AMP2 of the comparator 31 is replaced with a second amplifier section AMP2d and the third amplifier section AMP3 is replaced with a third amplifier section AMP3d. The first amplifier section AMP1 is identical to described above and description thereof will not be repeated.

The third amplifier section AMP3d includes an N-type transistor N9 (the fifth transistor) constituted by an NMOS transistor having the same conductivity type as the transistors N1 and N2 constituting the differential amplifier DAMP, a P-type transistor P8 (the fourth transistor) constituted by a PMOS transistor having a conductivity type other than that of the transistors N1 and N2, a capacitive element C3 (the first capacitive element), and a switching element SW1 (the third switching element). The gate of the transistor P8 is connected to the drain of the transistor N2 and the drain of the transistor P4, and the source of the transistor P8 is connected to the voltage source VDD. The standard signal output from the drain of the transistor N1 is input to the gate of the transistor P8 at the time of initialization, and the first comparison signal CO_1 output from the drain of the transistor N1 is input to the gate of the transistor P8 at the time of performing the comparing process. The drain of the transistor N9 is connected to the drain of the transistor P8, and the source of the transistor N9 is connected to the ground GND. The drain of the transistor N9 is also connected to the second amplifier section AMP2d.

The first terminal of the switching element SW1 is connected to the drain of the transistor N9 and the drain of the transistor P8, and the second terminal of the switching element SW1 is connected to the gate of the transistor N9. The first terminal of the capacitive element C3 is connected to the gate of the transistor N9 and the second terminal of the switching element SW1, and the second terminal of the capacitive element C3 is connected to the ground GND.

In the third amplifier section AMP3d having the above-mentioned constitution, the switching element SW1 connects the drain of the transistor N9 and the first terminal of the capacitive element C3 at the time of initialization, and disconnects the drain of the transistor N9 and the first terminal of the capacitive element C3 (maintains the disconnected state) at the time of performing the comparing process. The capacitive element C3 samples the standard voltage (the voltage of the drain of the transistor N9) based on the standard signal input to the gate of the transistor P8 at the time of initialization, and outputs the standard voltage to the first terminal thereof at the time of performing the comparing process. The detailed operation of the third amplifier section AMP3 will be described later.

The second amplifier section AMP2d includes an N-type transistor N11 (the third transistor) constituted by an NMOS transistor having the same conductivity type as the transistors N1 and N2 constituting the differential amplifier DAMP and a P-type transistor P10 (the sixth transistor) constituted by a PMOS transistor having a conductivity type other than that of the transistors N1 and N2. The gate of the transistor N11 is connected to the first terminal of the capacitive element C3 and the second terminal of the switching element SW1, and the source of the transistor N11 is connected to the ground GND. The gate of the transistor P10 is connected to the drain of the transistor P8 and the drain of the transistor N9, the drain of the transistor P10 is connected to the drain of the transistor N11, and the source of the transistor P10 is connected to the voltage source VDD.

In the second amplifier section AMP2d having the above-mentioned constitution, the transistor N11 outputs a current based on the standard voltage input to the gate thereof from the source thereof at the time of performing the comparing process. Accordingly, the comparator 31d (the second amplifier section AMP2d) outputs the second comparison signal CO_2 based on the current flowing in the transistor N11 from the junction point of the transistor N11 and the transistor P10 (the drain of the transistor N11 and the drain of the transistor P10) after the second timing at which the state of the first comparison signal CO_1 or a signal (the third comparison signal CO_3) based on the first comparison signal CO_1 is changed. The detailed operation of the second amplifier section AMP2d will be described later.

The operation of the comparator 31d will be described below. In the first reading of reading the pixel signal of the reset level and the second reading of reading the pixel signal of the signal level, the comparator 31d operates as follows.

(Operation at the Time of Initialization)

After a pixel signal Pixel from a unit pixel 3 is supplied to the second input terminal IN2 of the differential amplifier DAMP and the reference signal Ramp supplied to the first input terminal IN1 of the differential amplifier DAMP from the reference signal generator 19 is stabilized and before the comparator 31d starts the comparing process, the controller 20 activates (low-activates) a reset pulse Reset. Accordingly, the transistors P6 and P7 are changed to the ON state and short-circuit the gates and the drains of the transistors N1 and N2, and the voltages of two input terminals are reset using the operating points of the transistors N1 and N2 as a drain voltage.

At the operating point which is determined by this resetting (initialization), offset components of the voltages of two input terminals of the differential amplifier DAMP, that is, the voltages of the gates of the transistors N1 and N2, are almost cancelled. That is, the voltages of the two input terminals of the differential amplifier DAMP are reset to be substantially the same voltage.

Figure 10:
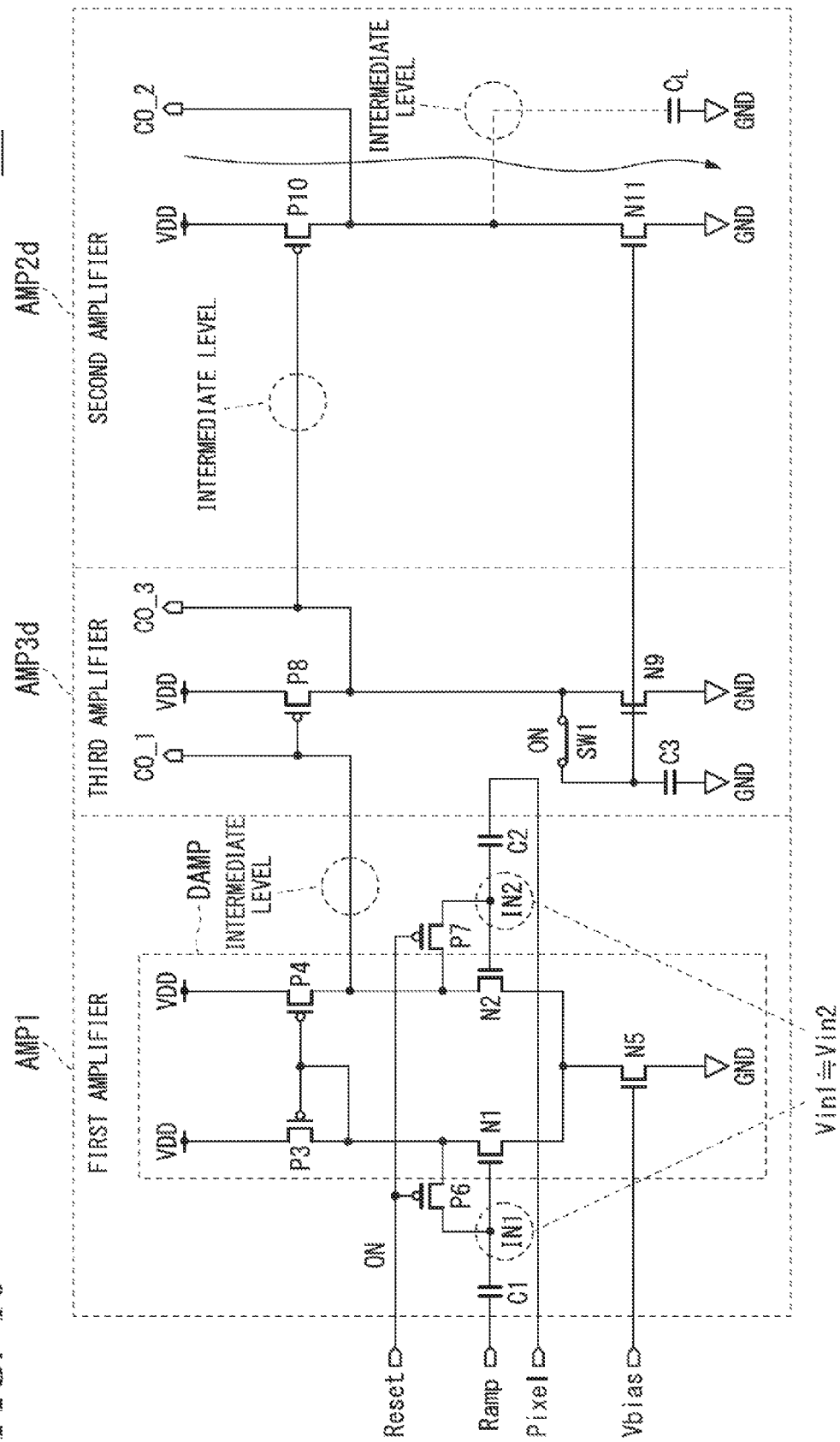
FIG. 10 is a circuit diagram illustrating an operation of the comparator of the imaging device according to the fourth embodiment of the present invention.

FIG. 10 illustrates a state of the comparator 31d at the time of initialization. When the transistors P6 and P7 are in the ON state, the voltage Vin1 of the first input terminal IN1 of the differential amplifier DAMP and the voltage Vin2 of the second input terminal IN2 of the differential amplifier DAMP are substantially equal to each other. Accordingly, a current flowing between the drain and the source of the transistor N1 and a current flowing between the drain and the source of the transistor N2 are substantially equal to each other. At this time, the transistor N2 outputs the standard signal from the drain thereof. At this time, the voltage of the drain of the transistor N2 is a voltage higher than the L level and has an intermediate level lower than a voltage which is lower by the threshold voltage of the transistor P8 than the source voltage VDD.

The standard signal output from the drain of the transistor N2 is input to the gate of the transistor P8. Since the voltage of the gate of the transistor P8 has the intermediate level, the transistor P8 is in the ON state and a current flows between the source and the drain of the transistor P8. At the time of initialization, the switching element SW1 is switched to the ON state and connects the drain of the transistor N9 and the first terminal of the capacitive element C3. Accordingly, the voltage of the gate of the transistor N9 is substantially equal to the voltage of the drain of the transistor N9. The transistor N9 is changed to the ON state and a current flows between the drain and the source of the transistor N9. At this time, the voltage of the drain of the transistor P8 is a voltage higher than the L level and has an intermediate level lower than a voltage which is lower by the threshold voltage of the transistor P10 than the source voltage VDD.

The signal output from the drain of the transistor P8 is input to the gate of the transistor P10. At this time, the voltage of the gate of the transistor P10 is a voltage higher than the L level and has an intermediate level lower than a voltage which is lower by the threshold voltage of the transistor P10 than the source voltage VDD. The currents flowing in the transistors P8 and N9 are limited by the standard signal having the intermediate level supplied to the gate of the transistor P8 and are sufficiently smaller than the penetrating current flowing in the inverter circuit.

A signal output from the junction point of the transistor P8 and the transistor N9 (the drain of the transistor P8 and the drain of the transistor N9) is input to the gate of the transistor P10. Since the voltage of the gate of the transistor P10 has an intermediate level, the transistor P10 is in the ON state and a current flows between the source and the drain of the transistor P10. The voltage of the first terminal of the capacitive element C3, that is, the voltage of the drain of the transistor P8, is input to the gate of the transistor N1. Accordingly, the transistor N1 is changed to the ON state and a current flows between the drain and the source of the transistor N11.

At this time, in the second amplifier section AMP2d, a current flows in a path passing through the transistor P10 and the transistor N11 from the voltage source VDD to the ground GND. This current is limited by the voltage supplied to the gate of the transistor N11 and is sufficiently smaller than the penetrating current flowing in the inverter circuit. The voltage of the drain of the transistor P10, that is, the voltage of the second comparison signal CO_2, has an intermediate level.

The capacitive element C3 samples the standard voltage (the voltage of the drain of the transistor N9) based on the signal input to the gate of the transistor N9. After the initialization ends, the transistors P6 and P7 are changed to the OFF state and disconnect the gates and the drains of the transistors N1 and N2. After the initialization ends, the switching element SW1 is changed to the OFF state and disconnects the drain of the transistor N9 and the first terminal of the capacitive element C3. Thereafter, the switching element SW1 is maintained in the OFF state until the comparing process ends.

(Operation when Voltage of Reference Signal Ramp≥Voltage of Pixel Signal Pixel)

Figure 11:
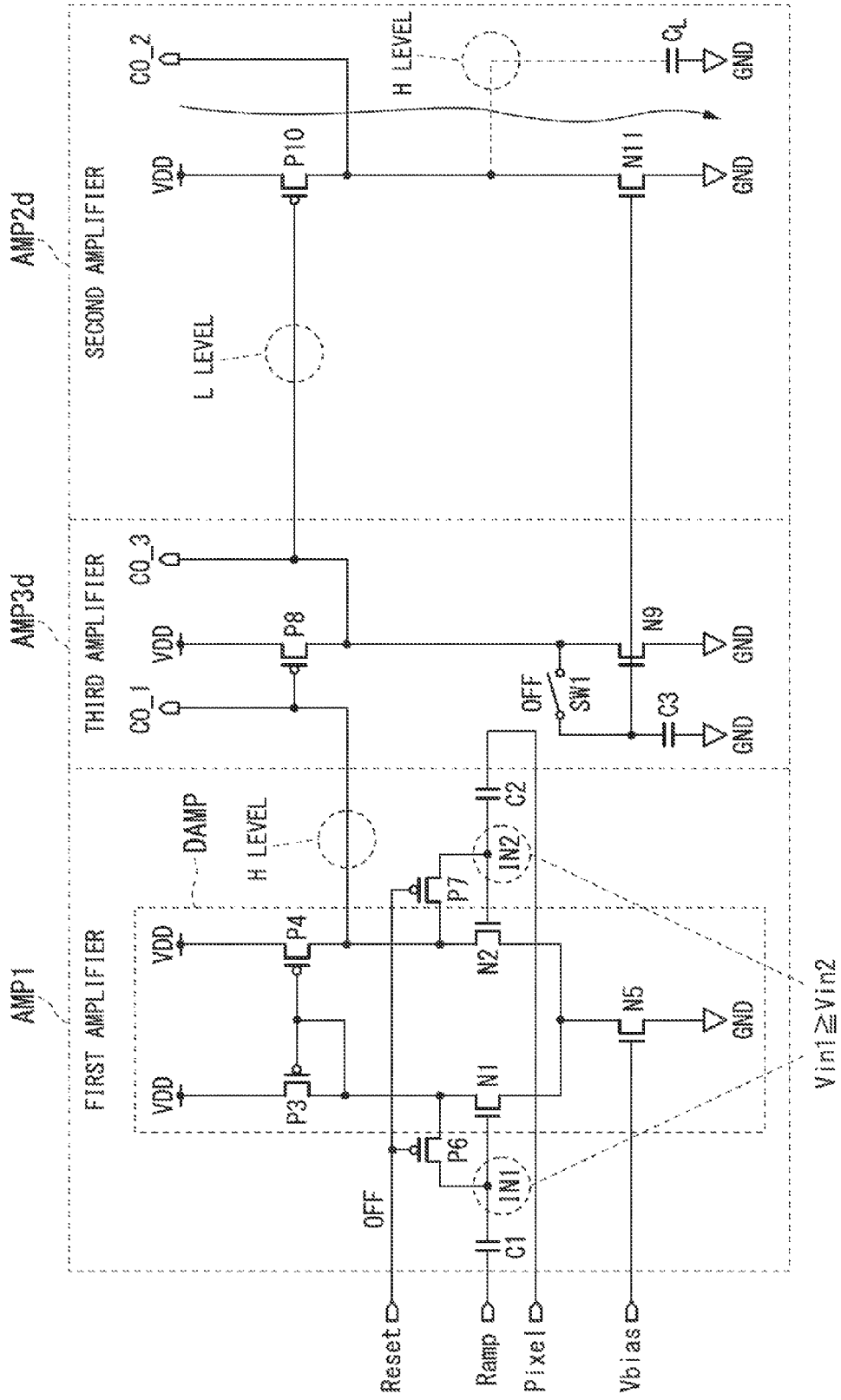
FIG. 11 is a circuit diagram illustrating an operation of the comparator of the imaging device according to the fourth embodiment of the present invention.

After the reference signal Ramp is supplied to the first input terminal IN1 of the differential amplifier DAMP and the voltage Vin1 of the first input terminal IN1 of the differential amplifier DAMP increases, the comparing process is started and the voltage of the reference signal Ramp decreases in a ramp shape. FIG. 11 illustrates a state of the comparator 31d until the voltage of the reference signal Ramp decreases and the voltage of the reference signal Ramp is substantially equal to the voltage of the pixel signal Pixel after the initialization ends and the voltage of the reference signal Ramp becomes higher than the voltage of the pixel signal Pixel.

When the voltage of the reference signal Ramp is higher than the voltage of the pixel signal Pixel, the voltage of the first input terminal IN1 of the differential amplifier DAMP is higher than the voltage of the second input terminal IN2 of the differential amplifier DAMP. In this case, the transistor N2 is in the OFF state and the voltage of the drain of the transistor N2 has the H level. That is, at the time of performing the comparing process, the transistor N2 outputs the first comparison signal CO_1 of the H level corresponding to the comparison result of the reference signal Ramp and the pixel signal Pixel from the drain thereof.

The first comparison signal CO_1 output from the drain of the transistor N2 is input to the gate of the transistor P8. Since the voltage of the gate of the transistor P8 is changed to the H level, the transistor P8 is changed to the OFF state. The capacitive element C3 outputs the standard voltage sampled at the time of initialization from the first terminal thereof. The transistor N9 is changed to the ON state by the standard voltage input to the gate thereof and outputs a current based on the standard voltage from the source thereof. Since the transistor P8 is in the OFF state, the voltage of the drain of the transistor N9 has the L level. That is, the transistor N9 outputs the third comparison signal CO_3 having the L level from the drain thereof.

The transistor N11 is changed to the ON state by the standard voltage input to the gate thereof from the capacitive element C3 and outputs a current based on the standard voltage from the source thereof. That is, the transistor N11 serves as a current source (a constant current source) at the time of performing the comparing process. At this time, the standard voltage input to the gate of the transistor N11 is a voltage which is equal to or higher than the threshold voltage required for changing the transistor N11 to the ON state and lower than the H level.

The third comparison signal CO_3 output from the junction point of the transistor P8 and the transistor N9 (the drain of the transistor P8 and the drain of the transistor N9) is input to the gate of the transistor P10. Since the voltage of the gate of the transistor P10 has the L level, the transistor P10 is in the ON state and a current flows between the source and the drain of the transistor P10. The current flowing in the transistor P10 is guided to the transistor N11.

At this time, in the second amplifier section AMP2, a current flows in a path passing through the transistor P10 and the transistor N11 from the voltage source VDD to the ground GND. This current is limited by the standard voltage supplied to the gate of the transistor N11 and is sufficiently smaller than the penetrating current flowing in the inverter circuit. The ON resistance of the transistor P10 is lower than the ON resistance at the time of initialization and the voltage of the drain of the transistor N11, that is, the voltage of the second comparison signal CO_2, is changed to the H level.

(Operation when Voltage of Reference Signal Ramp≤Voltage of Pixel Signal Pixel)

Figure 12:
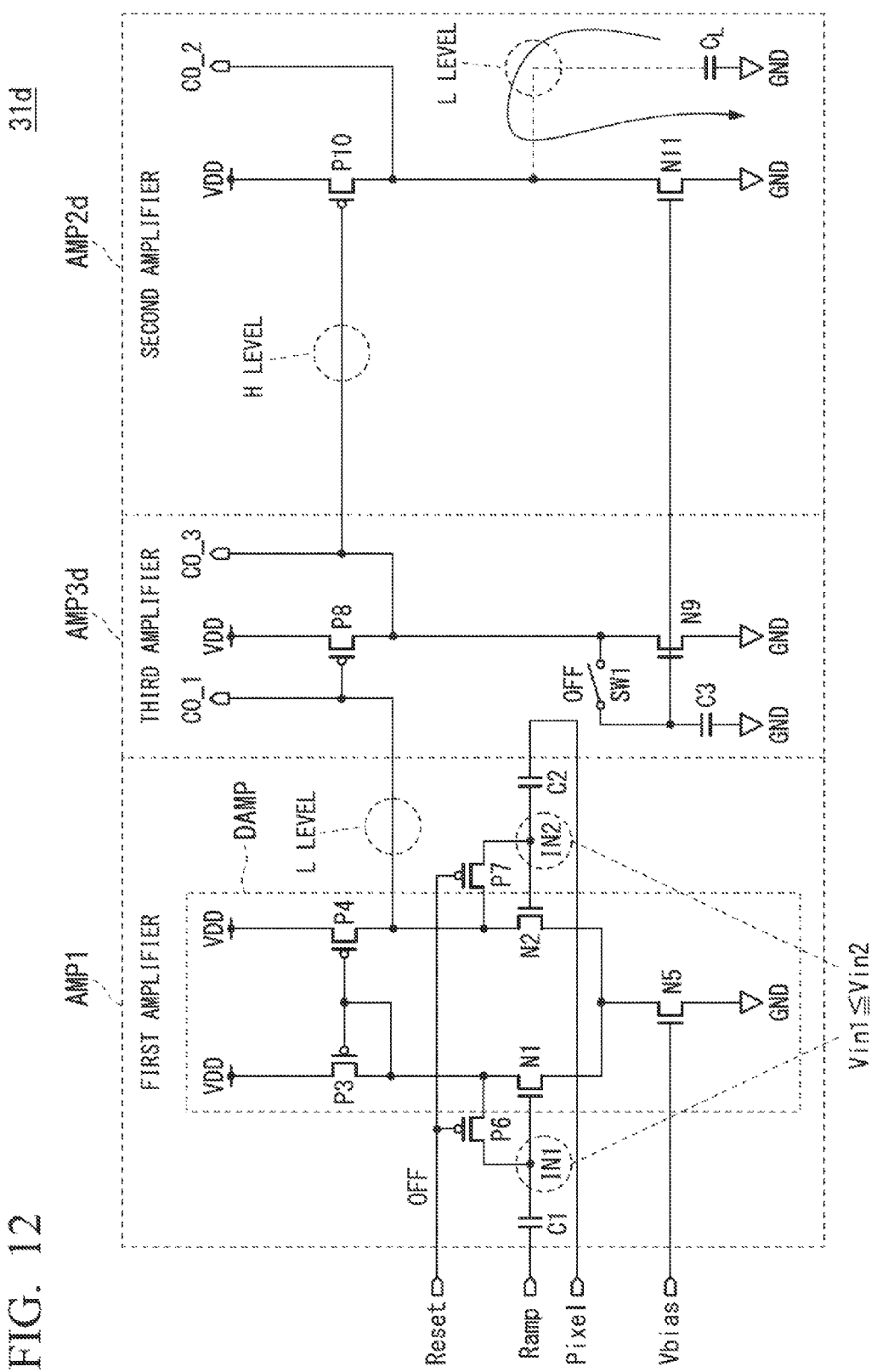
FIG. 12 is a circuit diagram illustrating an operation of the comparator of the imaging device according to the fourth embodiment of the present invention.

The voltage of the reference signal Ramp additionally decreases and the voltage of the reference signal Ramp becomes substantially equal to the voltage of the pixel signal Pixel (the second timing). Thereafter, the voltage of the reference signal Ramp becomes lower than the voltage of the pixel signal Pixel. FIG. 12 illustrates a state of the comparator 31d after the voltage of the reference signal Ramp decreases and the voltage of the reference signal Ramp becomes substantially equal to the voltage of the pixel signal Pixel.

When the voltage of the reference signal Ramp is lower than the voltage of the pixel signal Pixel, the voltage of the first input terminal IN1 of the differential amplifier DAMP is lower than the voltage of the second input terminal IN2 of the differential amplifier DAMP. In this case, since the transistor N1 is in the OFF state, a current does not flow between the drain and the source of the transistor N1, and the transistor N2 is in the ON state, the voltage of the drain of the transistor N2 has the L level. That is, at the time of performing the comparing process, the transistor N2 outputs the first comparison signal CO_1 of the L level corresponding to the comparison result of the reference signal Ramp and the pixel signal Pixel from the drain thereof.

The first comparison signal CO_1 output from the drain of the transistor N2 is input to the gate of the transistor P8. Since the voltage of the gate of the transistor P8 is changed to the L level, the transistor P8 is changed to the ON state and a current flows between the source and the drain of the transistor P8. The capacitive element C3 outputs the standard voltage sampled at the time of initialization from the first terminal thereof. The transistor N9 is changed to the ON state by the standard voltage input to the gate thereof and outputs a current based on the standard voltage from the source thereof. The current flowing in the transistor P8 is guided to the transistor N9. Since the ON resistance of the transistor P8 is lower than the ON resistance of the transistor N9, the voltage of the drain of the transistor N9 has the H level. That is, the transistor N9 outputs the third comparison signal CO_3 having the H level from the drain thereof.

The transistor N11 is changed to the ON state by the standard voltage input to the gate thereof from the capacitive element C3 and outputs a current based on the standard voltage from the source thereof. The standard voltage input to the gate of the transistor N11 is a voltage which is equal to or higher than the threshold voltage required for changing the transistor N11 to the ON state and lower than the H level.

The third comparison signal CO_3 output from the junction point of the transistor P8 and the transistor N9 (the drain of the transistor P8 and the drain of the transistor N9) is input to the gate of the transistor P10. Since the voltage of the gate of the transistor P10 has the H level, the transistor P10 is in the OFF state.

At this time, in the second amplifier section AMP2, a current flows in a path passing through the output load $C_L$ and the transistor N11 from the ground GND to the ground GND. This current is substantially equal to the current flowing in the second amplifier section AMP2d when the voltage of the reference signal Ramp is higher than the voltage of the pixel signal Pixel. This current is limited by the standard voltage supplied to the gate of the transistor N11 and is sufficiently smaller than the penetrating current flowing in the inverter circuit. Since the transistor P10 is in the OFF state, the voltage of the drain of the transistor N11, that is, the voltage of the second comparison signal CO_2, is changed to the L level.

The latch controller 32 changes the latch circuits L_0 to L_6 of the latch section 33 to the enabled state at the second timing based on the first comparison signal CO_1 or the third comparison signal CO_3. That is, the latch controller 32 changes the latch circuits L_0 to L_6 of the latch section 33 at the second timing at which the voltage of the first comparison signal CO_1 is changed from the H level to the L level or at the second timing at which the voltage of the third comparison signal CO_3 is changed from the L level to the H level. The latch controller 32 changes the latch circuits L_0 to L_7 of the latch section 33 to the disabled state at the third timing based on the second comparison signal CO_2.

The voltage of the output load $C_L$ has the H level immediately before the second timing. After the second timing, the output load $C_L$ discharges and the voltage of the output load $C_L$ linearly decreases with a slope corresponding to the constant current value flowing in the transistor N11. At a timing (the third timing) at which this voltage becomes lower than a circuit threshold value of the latch controller 32, the latch controller 32 causes the latch section 33 to perform a latching operation by changing the latch circuits L_0 to L_7 of the latch section 33 to the disabled state. That is, the latch controller 32 causes the latch section 33 to perform a latching operation at the third timing which is determined by the slope of the voltage variation (the current value flowing in the transistor N11) of the second comparison signal CO_2 and the circuit threshold value of the latch controller 32 after the second timing.

When a bounce of the ground voltage GND occurs during the comparing process, the voltage of the second terminal of the capacitive element C3 connected to the ground GND varies and the voltage of the first terminal of the capacitive element C3 varies with the variation. Accordingly, the standard voltage output from the first terminal of the capacitive element C3, that is, the voltage of the gate of the transistor N11, varies. Since the voltage of the source of the transistor N11 connected to the ground GND also varies but the voltage of the gate of the transistor N11 varies with the variation, the variation of the voltage between the gate and the source of the transistor N11 is suppressed. That is, the variation of the current output from the source of the transistor N11 is suppressed. As described above, the third timing is a timing based on the current output from the transistor N11. Accordingly, even when the ground GND varies during the comparing process, it is possible to suppress a variation of the third timing.

The current flowing from the voltage source VDD to the ground GND in the second amplifier section AMP2d and the third amplifier section AMP3d is sufficiently smaller than the penetrating current flowing in the inverter circuit. Accordingly, it is possible to suppress a bounce of the source voltage VDD and the ground GND.

In this embodiment, even when a bounce of the ground voltage GND occurs at the time of performing the comparing process, the standard voltage of the first terminal of the capacitive element C3 varies with the bounce and thus the variation of the voltage between the gate and the source of the transistor N11 is suppressed. Accordingly, since the variation of the current flowing in the transistor N11 is suppressed, it is possible to suppress the variation of the third timing due to the bounce of the ground voltage GND. As a result, it is possible to reduce deterioration of AD conversion accuracy.

By causing the capacitive element C3 to sample the standard voltage at the time of initialization and causing the capacitive element C3 to output the standard voltage at the time of performing the comparing process, it is possible to make a voltage source for determining the standard voltage unnecessary.

By constituting the comparator 31d as illustrated in FIG. 9, it is possible to simplify the circuit constitution of the comparator 31d.

By constituting the latch controller 32 to activate (enabled state) the latch section 33 at the second timing based on the first comparison signal CO_1 or the third comparison signal CO_3 based on the first comparison signal CO_1, it is possible to simplify the circuit constitution of the latch controller 32.

Fifth Embodiment

Figure 13:
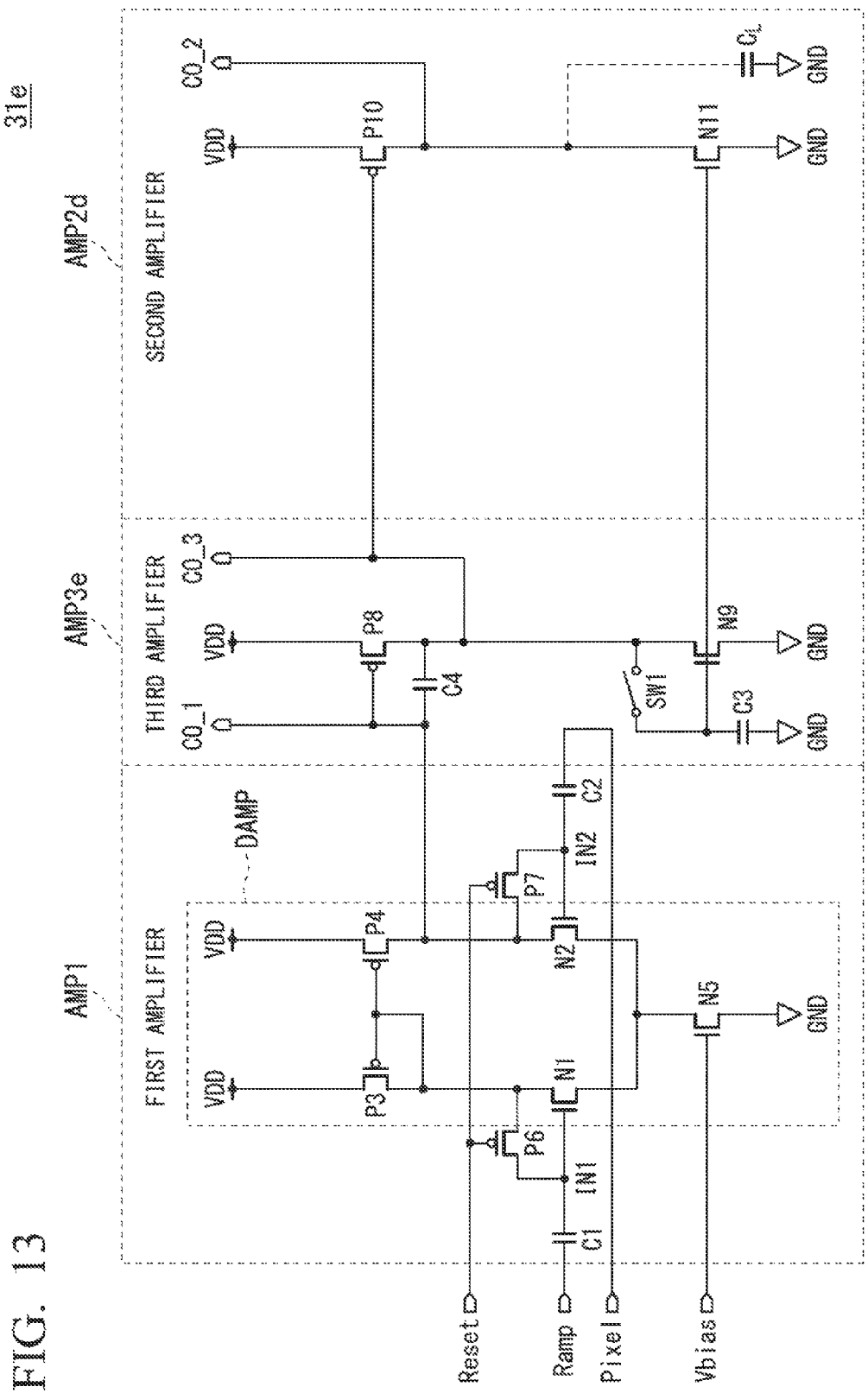
FIG. 13 is a circuit diagram illustrating a constitution of a comparator of an imaging device according to a fifth embodiment of the present invention.

A fifth embodiment of the present invention will be described below. In this embodiment, the comparator 31 of the imaging device 1 illustrated in FIG. 1 is replaced with a comparator 31e illustrated in FIG. 13. FIG. 13 illustrates an example of a constitution of the comparator 31e according to this embodiment.

In the comparator 31e, the third amplifier section AMP3d of the comparator 31d illustrated in FIG. 9 is replaced with a third amplifier section AMP3e. In the third amplifier section AMP3e, a capacitive element C4 (the fourth capacitive element) having a first terminal connected to the gate of the transistor P8 (the fourth transistor) and a second terminal connected to the drain of the transistor P8 is added. Other constitutions are identical to described above and description thereof will not be repeated.

The capacitive element C4 exhibits a mirror effect. By connecting the capacitive element C4 between the input and the output of the transistor P8, a constitution equivalent to the constitution in which a capacitor having capacitance corresponding to a multiple of the gain of the transistor P8 is connected to the input of the transistor P8 is obtained. By connecting the capacitive element C4, the frequency band of the comparator 31e is limited. More specifically, the cut-off frequency of the comparator 31e serving as a low-pass filter decreases. Accordingly, it is possible to reduce noise.

Sixth Embodiment

Figure 14:
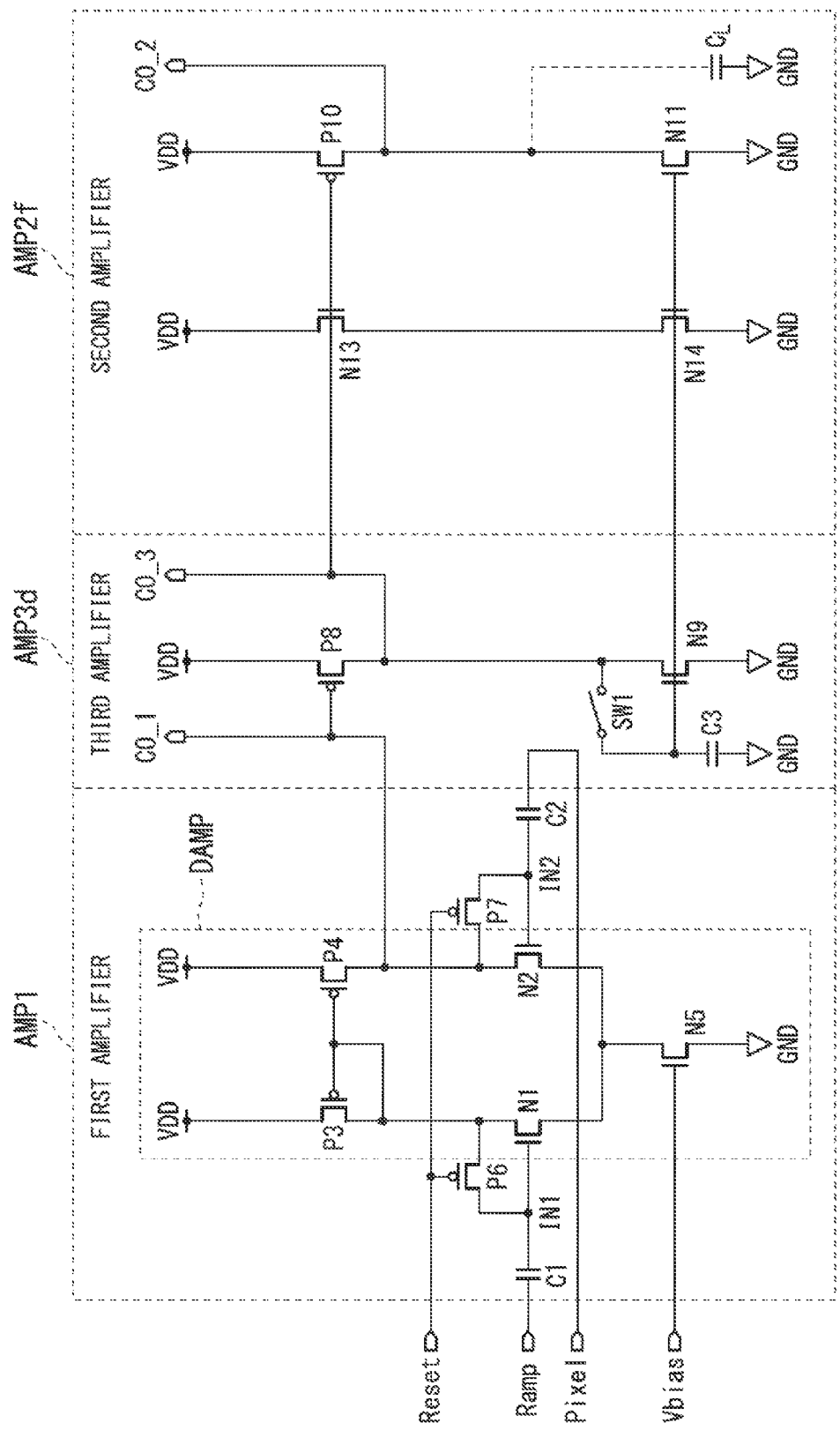
FIG. 14 is a circuit diagram illustrating a constitution of a comparator of an imaging device according to a sixth embodiment of the present invention.

A sixth embodiment of the present invention will be described below. In this embodiment, the comparator 31 of the imaging device 1 illustrated in FIG. 1 is replaced with a comparator 31f illustrated in FIG. 14. FIG. 14 illustrates an example of a constitution of the comparator 31f according to this embodiment.

In the comparator 31f, the second amplifier section AMP2d of the comparator 31d illustrated in FIG. 9 is replaced with a second amplifier section AMP2f. In the second amplifier section AMP2f, N-type transistors N13 and N14 constituted by NMOS transistors are added to the second amplifier section AMP2d. The gate of the transistor N13 is connected to the drain of the transistor P8 and the drain of the transistor N9. The drain of the transistor N13 is connected to the voltage source VDD. The gate of the transistor N14 is connected to the gate of the transistor N11, the first terminal of the capacitive element C3, and the second terminal of the switching element SW1, the drain of the transistor N14 is connected to the source of the transistor N13, and the source of the transistor N14 is connected to the ground GND. Other constitutions are identical to described above and description thereof will not be repeated.

The transistors N13 and N14 output a current based on the standard voltage, which is output from the first terminal of the capacitive element C3 at the time of performing the comparing process, from the sources thereof.

The operation of the comparator 31f will be described below. The operation at the time of initialization is identical to described above and description thereof will not be repeated.

(Operation when Voltage of Reference Signal Ramp≥Voltage of Pixel Signal Pixel)

After the reference signal Ramp is supplied to the first input terminal IN1 of the differential amplifier DAMP and the voltage Vin1 of the first input terminal IN1 of the differential amplifier DAMP increases, the comparing process is started and the voltage of the reference signal Ramp decreases in a ramp shape.

As described above, the voltage of the drain of the transistor P8 has the L level. Accordingly, the voltage of the gate of the transistor N13 connected to the drain of the transistor P8 has the L level. At this time, since the transistor N13 is in the OFF state, a current does not flow in the transistors N13 and N14.

(Operation when Voltage of Reference Signal Ramp≤Voltage of Pixel Signal Pixel)

The voltage of the reference signal Ramp additionally decreases and the voltage of the reference signal Ramp becomes substantially equal to the voltage of the pixel signal Pixel (the second timing). Thereafter, the voltage of the reference signal Ramp becomes lower than the voltage of the pixel signal Pixel.

As described above, the voltage of the drain of the transistor P8 has the H level. Accordingly, the transistor N13 is in the ON state. The transistor N14 is changed to the ON state by the standard voltage input to the gate thereof from the first terminal of the capacitive element C3, and outputs a current based on the standard voltage from the drain thereof. Accordingly, a current flows between the drains and the sources of the transistors N13 and N14.

At the time of performing the comparing process, in the second amplifier section AMP2f, a current flows in a path passing through the transistor P10 and the transistor N11 from the voltage source VDD to the ground GND until the second timing. After the second timing, in the second amplifier section AMP2f, a current flows in a path passing through the output load $C_L$ and the transistor N11 from the ground GND to the ground GND. When the output load $C_L$ discharges, the current does not flow and thus a current does not flow in the path passing through the transistor P10 and the transistor N11 from the voltage source VDD to the ground GND.

On the other hand, after the second timing, in the second amplifier section AMP2f, a current flows in a path passing through the transistor N13 and the transistor N14 from the voltage source VDD to the ground GND. Accordingly, after the second timing, it is possible to compensate for a current by the current not flowing in the path passing through the transistor P10 and the transistor N11 and to suppress a variation of the current in the second amplifier section AMP2f before and after the second timing. As a result, in this embodiment, it is possible to suppress occurrence of bounce of the source voltage VDD and the ground voltage GND and to reduce deterioration in AD conversion accuracy.

The transistors N13 and N14 of this embodiment may be added to the comparator 31e illustrated in FIG. 13.

Seventh Embodiment

Figure 15:
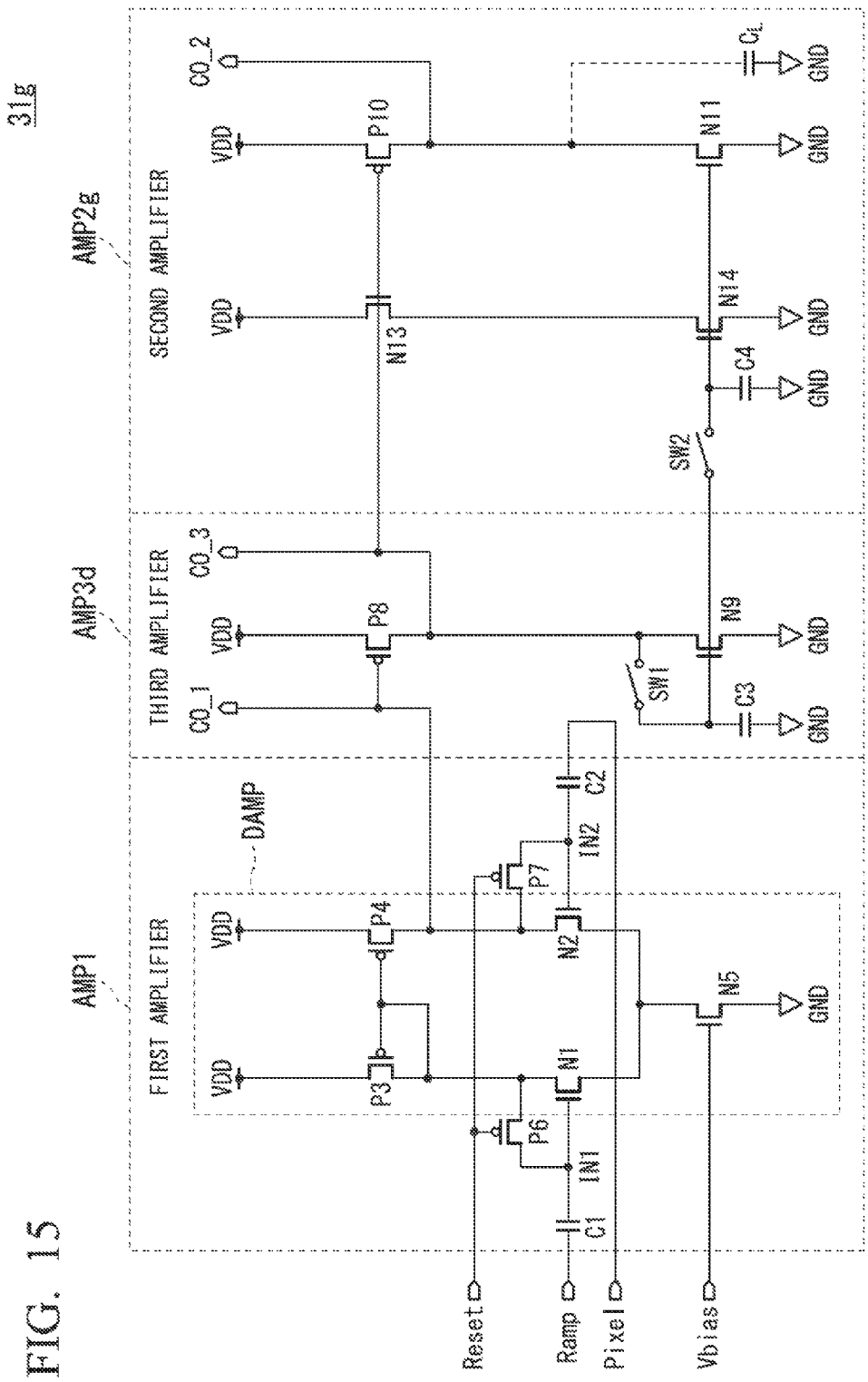
FIG. 15 is a circuit diagram illustrating a constitution of a comparator of an imaging device according to a seventh embodiment of the present invention.
Figure 16:
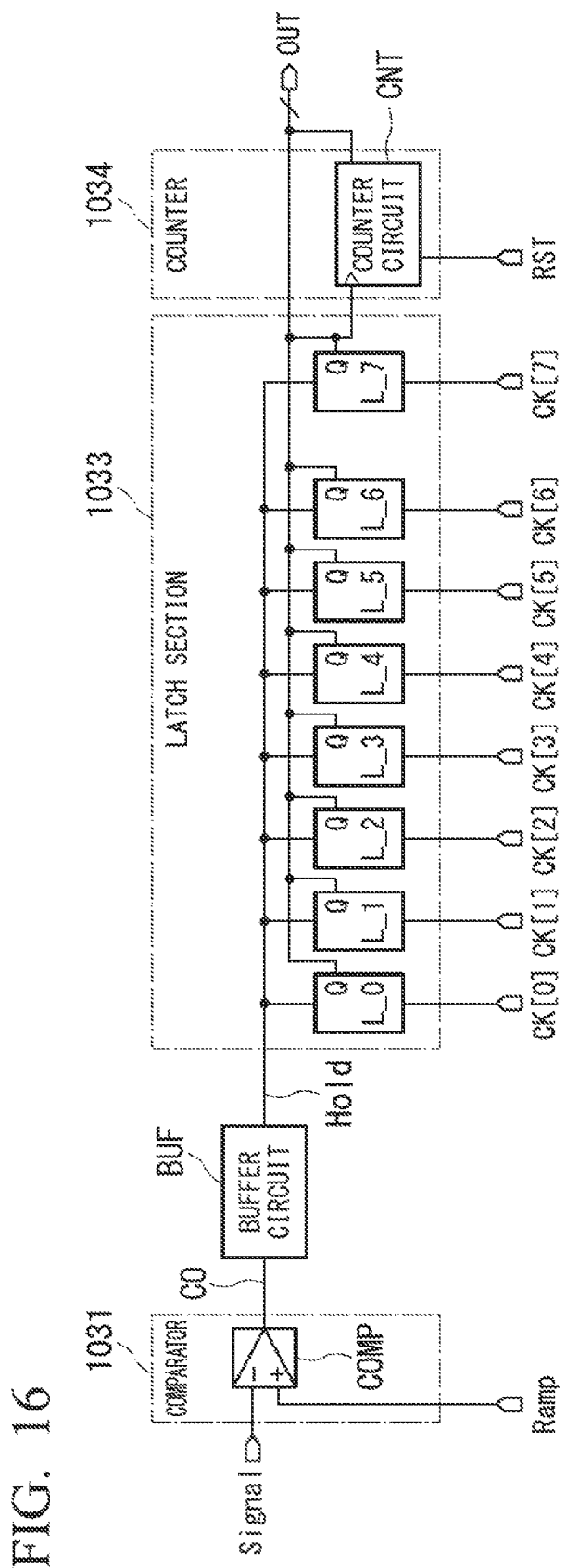
FIG. 16 is a block diagram illustrating a part of a constitution of a tdcSS type AD conversion circuit according to a first conventional example.
Figure 17:
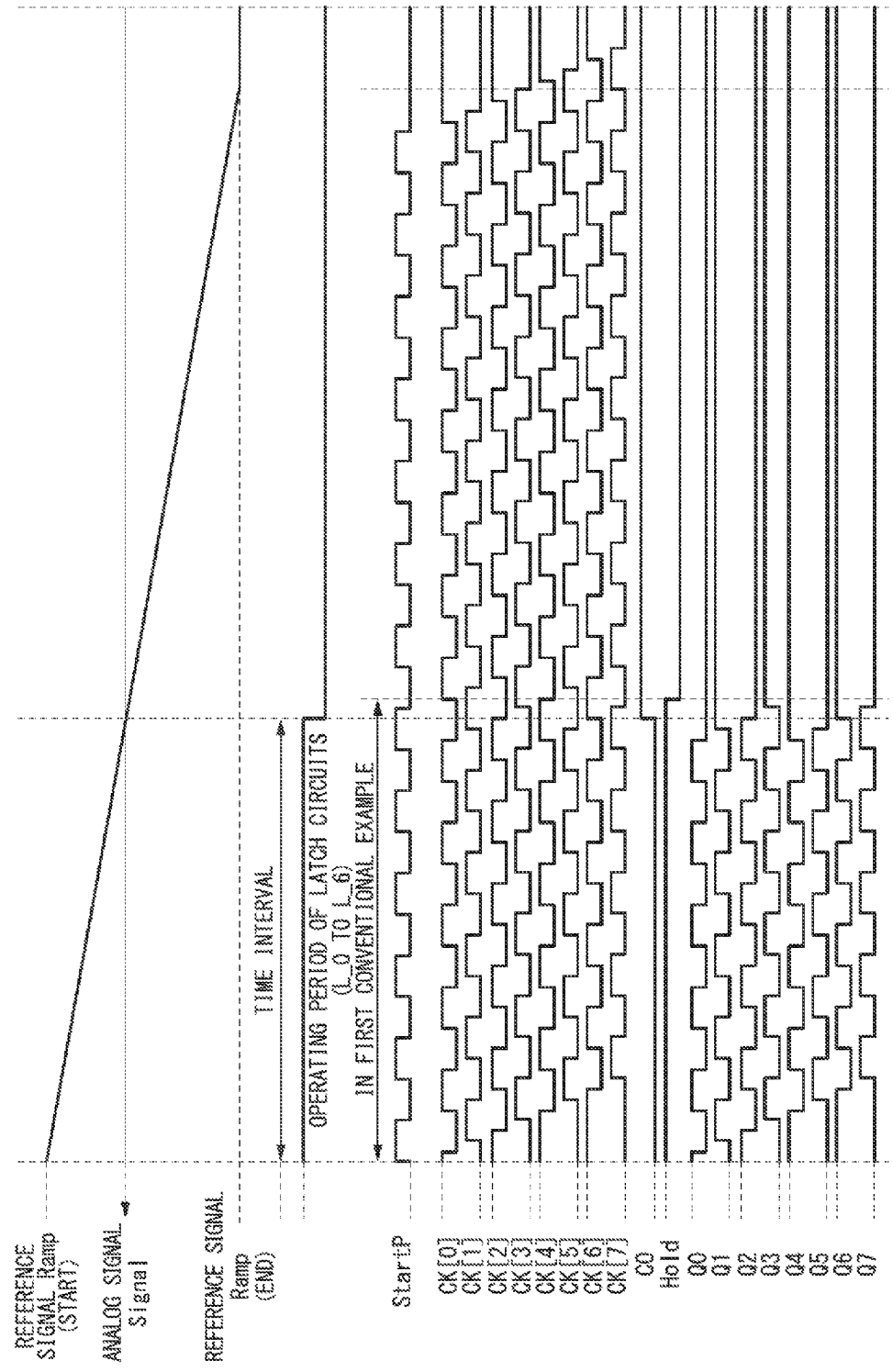
FIG. 17 is a timing chart illustrating the operation of the tdcSS type AD conversion circuit according to the first conventional example.
Figure 18:
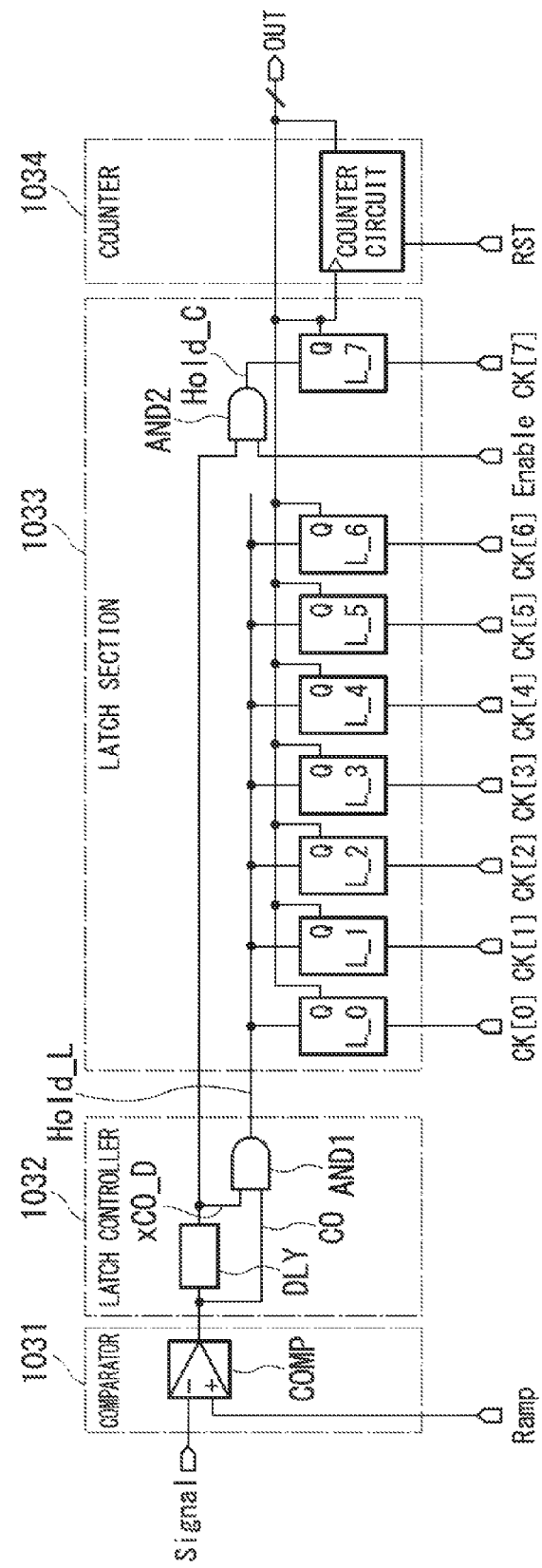
FIG. 18 is a block diagram illustrating a part of a constitution of a tdcSS type AD conversion circuit according to a second conventional example.
Figure 19:
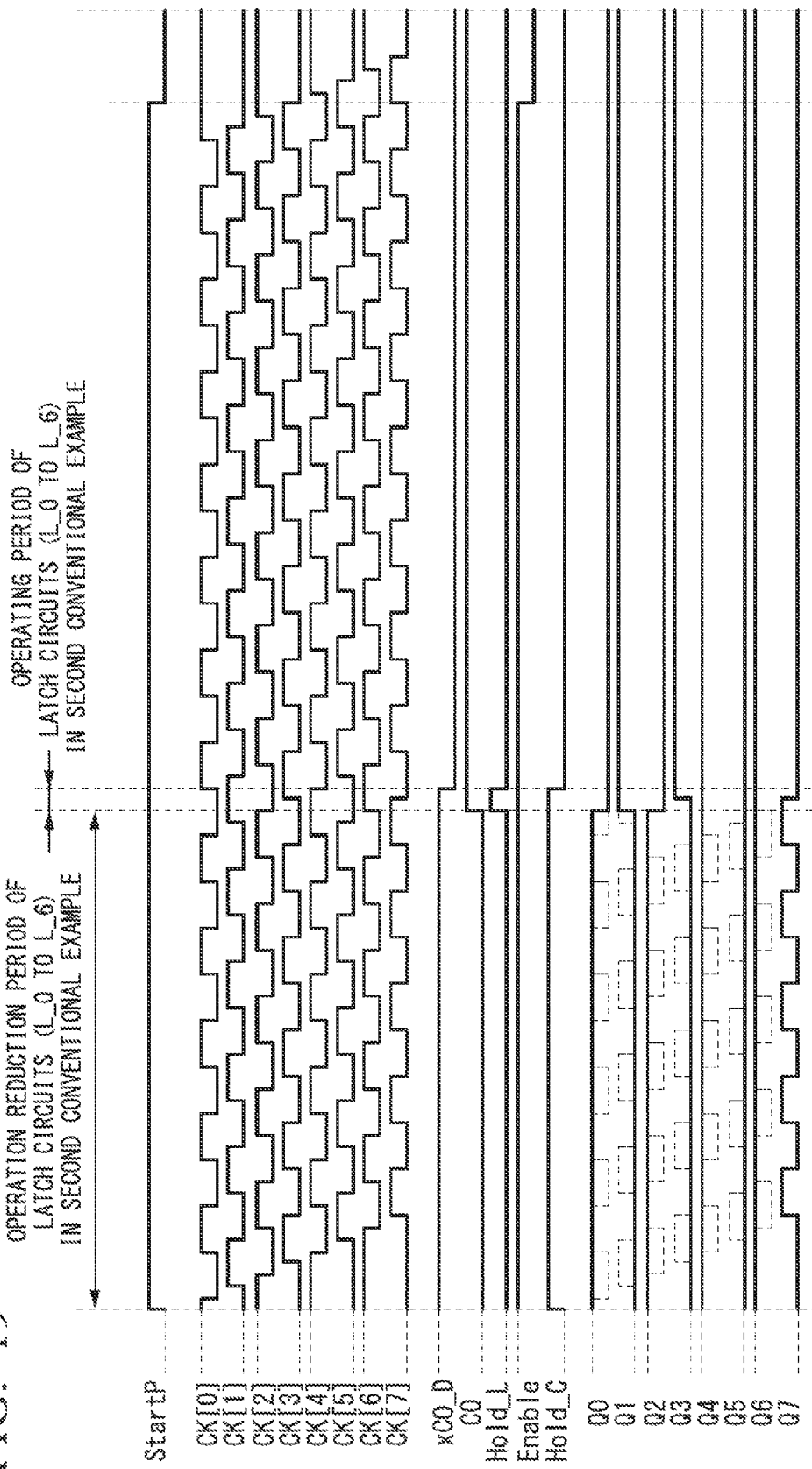
FIG. 19 is a timing chart illustrating the operation of the tdcSS type AD conversion circuit according to the second conventional example.

A seventh embodiment of the present invention will be described below. In this embodiment, the comparator 31 of the imaging device 1 illustrated in FIG. 1 is replaced with a comparator 31g illustrated in FIG. 15. FIG. 15 illustrates an example of a constitution of the comparator 31g according to this embodiment.

In the comparator 31g, the second amplifier section AMP2f of the comparator 31f illustrated in FIG. 14 is replaced with a second amplifier section AMP2g. In the second amplifier section AMP2g, a switching element SW2 and a capacitive element C4 are added. The first terminal of the switching element SW2 is connected to the first terminal of the capacitive element C3 and the second terminal of the switching element SW1, and the second terminal of the switching element SW2 is connected to the gate of the transistor N11 and the gate of the transistor N14. The first terminal of the capacitive element C4 is connected to the second terminal of the switching element SW2, the gate of the transistor N11, and the gate of the transistor N14, and the second terminal of the capacitive element C4 is connected to the ground GND. The distance between the capacitive element C4 and the transistor N11 is smaller than the distance between the capacitive element C3 and the transistor N11. The switching element SW2 connects the first terminal of the capacitive element C3 and the first terminal of the capacitive element C4 at the time of initialization, and disconnects the first terminal of the capacitive element C3 and the first terminal of the capacitive element C4 (maintains the disconnected state) at the time of performing the comparing process. Other constitutions are identical to described above and description thereof will not be repeated.

The operation of the comparator 31g will be described below. Operations that have been described above will not be described again.

At the time of initialization, the switching element SW1 and the switching element SW2 are switched to the ON state. At the time of initialization, the capacitive element C3 and the capacitive element C4 sample the standard voltage (the voltage of the drain of the transistor N9) based on the signal input to the gate of the transistor N9.

After the initialization ends, the switching element SW1 is switched to the OFF state. The switching element SW2 is switched to the OFF state and disconnects the first terminal of the capacitive element C3 and the first terminal of the capacitive element C4. At the time of performing the comparing process, the standard voltage output from the first terminal of the capacitive element C4 is supplied to the gate of the transistor N11 and the gate of the transistor N14. Other constitutions are identical to described above and description thereof will not be repeated.

In this embodiment, the transistors N13 and N14 are provided, but the transistors N13 and N14 are not essential for this embodiment.

The switching element SW2 and the capacitive element C4 of this embodiment may be added to the comparator 31e illustrated in FIG. 13.

In the fourth to sixth embodiments, noise may be superimposed on the standard voltage supplied from the capacitive element C3 to the transistor N11. In this embodiment, since the standard voltage is supplied to the transistor N11 from the capacitive element C4 closer to the transistor N11 than the capacitive element C3, it is possible to reduce noise which is superimposed on the standard voltage. Accordingly, since an influence of noise on the current (the current flowing in the transistor N11) for determining the slope of the voltage variation of the output load $C_L$ is reduced, it is possible to suppress a variation of the third timing. As a result, it is possible to reduce deterioration in AD conversion accuracy.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An imaging device comprising:
an imaging section in which a plurality of pixels each having a photoelectric conversion element are arranged in a matrix shape;
a clock generator that generates a plurality of phase signals having different phases;
a reference signal generator that generates a reference signal which increases or decreases with a lapse of time;
a comparator that is disposed to correspond to each column or columns of an array of the plurality of pixels, performs a comparing process of comparing a pixel signal output from each pixel with the reference signal, and outputs a first comparison result signal and a second comparison result signal indicating a result of the comparing process;
a latch section that is disposed to correspond to the comparator and latches logic states of the plurality of phase signals; and
a latch controller that is disposed to correspond to the comparator, activates the latch section depending on a comparison result indicated by the first comparison result signal, and causes the latch section to perform a latching operation depending on a comparison result indicated by the second comparison result signal,
wherein the comparator includes:
a differential amplifier that includes a first transistor to a gate of which the reference signal is input and a second transistor to a gate of which the pixel signal is input, outputs a standard signal at a time of initialization of voltages of the gate of the first transistor and the gate of the second transistor, and outputs a first comparison signal corresponding to a result of comparing the reference signal with the pixel signal at a time of performing the comparing process;
a third transistor that is a transistor operating as a constant current source, has a source electrically connected to a voltage source, and outputs a current at the time of performing the comparing process; and
a first capacitive element that has a first terminal electrically connected to a gate of the third transistor and a second terminal electrically connected to the voltage source, samples a standard voltage based on the standard signal at the time of the initialization, and outputs the standard voltage to the first terminal at the time of performing the comparing process,
the first comparison result signal is generated from the first comparison signal,
the second comparison result signal is generated from an output of a drain of the third transistor, and
a timing at which a state of the second comparison result signal is changed is later than a timing at which a state of the first comparison result signal is changed,
the comparator further includes:
a first switching element that electrically connects the gate and a drain of the first transistor at the time of the initialization and electrically disconnects the gate and the drain of the first transistor at the time of performing the comparing process;
a second switching element that electrically connects the gate and a drain of the second transistor at the time of the initialization and electrically disconnects the gate and the drain of the second transistor at the time of performing the comparing process;
a second capacitive element that has a first terminal electrically connected to the gate of the first transistor and a second terminal to which the reference signal is input and samples a voltage of the drain of the first transistor at the time of the initialization; and
a third capacitive element that has a first terminal electrically connected to the gate of the second transistor and a second terminal to which the pixel signal is input and samples a voltage of the drain of the second transistor at the time of the initialization, wherein the first transistor and the second transistor are transistors of a first conductivity type,
the third transistor is a transistor of a second conductivity type,
the comparator includes:
a fourth transistor of the first conductivity type, to a gate of which the standard signal and the first comparison signal are input;
a fifth transistor of the first conductivity type, whose drain is electrically connected to a source of the fourth transistor;
a sixth transistor of the first conductivity type, to a gate of which a signal output from a junction point of the fourth transistor and the fifth transistor is input and a drain thereof is electrically connected to the drain of the third transistor; and a third switching element that electrically connects the drain of the third transistor and the first terminal of the first capacitive element at the time of the initialization and electrically disconnects the drain of the third transistor and the first terminal of the first capacitive element at the time of performing the comparing process, the first capacitive element samples the standard voltage which is a voltage of the drain of the third transistor at the time of the initialization, and the second comparison result signal is output from a junction point of the third transistor and the sixth transistor.

2. An imaging device comprising:

an imaging section in which a plurality of pixels each having a photoelectric conversion element are arranged in a matrix shape;

a clock generator that generates a plurality of phase signals having different phases;

a reference signal generator that generates a reference signal which increases or decreases with a lapse of time;

a comparator that is disposed to correspond to each column or columns of an array of the plurality of pixels, performs a comparing process of comparing a pixel signal output from each pixel with the reference signal, and outputs a first comparison result signal and a second comparison result signal indicating a result of the comparing process;

a latch section that is disposed to correspond to the comparator and latches logic states of the plurality of phase signals; and a latch controller that is disposed to correspond to the comparator, activates the latch section depending on a comparison result indicated by the first comparison result signal, and causes the latch section to perform a latching operation depending on a comparison result indicated by the second comparison result signal, wherein the comparator includes:

a differential amplifier that includes a first transistor to a gate of which the reference signal is input and a second transistor to a gate of which the pixel signal is input, outputs a standard signal at a time of initialization of voltages of the gate of the first transistor and the gate of the second transistor, and outputs a first comparison signal corresponding to a result of comparing the reference signal with the pixel signal at a time of performing the comparing process;

a third transistor that is a transistor operating as a constant current source, has a source electrically connected to a voltage source, and outputs a current at the time of performing the comparing process; and a first capacitive element that has a first terminal electrically connected to a gate of the third transistor and a second terminal electrically connected to the voltage source, samples a standard voltage based on the standard signal at the time of the initialization, and outputs the standard voltage to the first terminal at the time of performing the comparing process, the first comparison result signal is generated from the first comparison signal, the second comparison result signal is generated from an output of a drain of the third transistor, and a timing at which a state of the second comparison result signal is changed is later than a timing at which a state of the first comparison result signal is changed, the comparator further includes:

a first switching element that electrically connects the gate and a drain of the first transistor at the time of the initialization and electrically disconnects the gate and the drain of the first transistor at the time of performing the comparing process;

a second switching element that electrically connects the gate and a drain of the second transistor at the time of the initialization and electrically disconnects the gate and the drain of the second transistor at the time of performing the comparing process;

a second capacitive element that has a first terminal electrically connected to the gate of the first transistor and a second terminal to which the reference signal is input and samples a voltage of the drain of the first transistor at the time of the initialization; and a third capacitive element that has a first terminal electrically connected to the gate of the second transistor and a second terminal to which the pixel signal is input and samples a voltage of the drain of the second transistor at the time of the initialization, wherein the first transistor and the second transistor are transistors of a first conductivity type, the third transistor is a transistor of a second conductivity type, the comparator further includes:

a fourth transistor of the first conductivity type, to a gate of which the standard signal and the first comparison signal are input and whose drain is electrically connected to the drain of the third transistor; and a third switching element that electrically connects the drain of the third transistor and the first terminal of the first capacitive element at the time of the initialization and electrically disconnects the drain of the third transistor and the first terminal of the first capacitive element at the time of performing the comparing process, the first capacitive element samples the standard voltage which is a voltage of the drain of the third transistor at the time of the initialization, and the second comparison result signal is output from a junction point of the third transistor and the fourth transistor.

3. An imaging device comprising:

an imaging section in which a plurality of pixels each having a photoelectric conversion element are arranged in a matrix shape;

a clock generator that generates a plurality of phase signals having different phases;

a reference signal generator that generates a reference signal which increases or decreases with a lapse of time;

a comparator that is disposed to correspond to each column or columns of an array of the plurality of pixels, performs a comparing process of comparing a pixel signal output from each pixel with the reference signal, and outputs a first comparison result signal and a second comparison result signal indicating a result of the comparing process;

a latch section that is disposed to correspond to the comparator and latches logic states of the plurality of phase signals; and a latch controller that is disposed to correspond to the comparator, activates the latch section depending on a comparison result indicated by the first comparison result signal, and causes the latch section to perform a latching operation depending on a comparison result indicated by the second comparison result signal,
wherein the comparator includes:
a differential amplifier that includes a first transistor to a gate of which the reference signal is input and a second transistor to a gate of which the pixel signal is input, outputs a standard signal at a time of initialization of voltages of the gate of the first transistor and the gate of the second transistor, and outputs a first comparison signal corresponding to a result of comparing the reference signal with the pixel signal at a time of performing the comparing process;
a third transistor that is a transistor operating as a constant current source, has a source electrically connected to a voltage source, and outputs a current at the time of performing the comparing process; and
a first capacitive element that has a first terminal electrically connected to a gate of the third transistor and a second terminal electrically connected to the voltage source, samples a standard voltage based on the standard signal at the time of the initialization, and outputs the standard voltage to the first terminal at the time of performing the comparing process,
the first comparison result signal is generated from the first comparison signal,
the second comparison result signal is generated from an output of a drain of the third transistor, and
a timing at which a state of the second comparison result signal is changed is later than a timing at which a state of the first comparison result signal is changed,
the comparator further includes:
a first switching element that electrically connects the gate and a drain of the first transistor at the time of the initialization and electrically disconnects the gate and the drain of the first transistor at the time of performing the comparing process;
a second switching element that electrically connects the gate and a drain of the second transistor at the time of the initialization and electrically disconnects the gate and the drain of the second transistor at the time of performing the comparing process;
a second capacitive element that has a first terminal electrically connected to the gate of the first transistor and a second terminal to which the reference signal is input and samples a voltage of the drain of the first transistor at the time of the initialization; and
a third capacitive element that has a first terminal electrically connected to the gate of the second transistor and a second terminal to which the pixel signal is input and samples a voltage of the drain of the second transistor at the time of the initialization, wherein the first transistor, the second transistor, and the third transistor are transistors of a first conductivity type,
the comparator further includes:
a fourth transistor of the second conductivity type, to a gate of which the standard signal and the first comparison signal are input;
a fifth transistor of the first conductivity type, whose drain is electrically connected to a drain of the fourth transistor;
a sixth transistor of the second conductivity type, to a gate of which a signal output from a junction point of the fourth transistor and the fifth transistor is input and a drain thereof is electrically connected to the drain of the third transistor; and
a third switching element that electrically connects the drain of the fifth transistor and the first terminal of the first capacitive element at the time of the initialization and electrically disconnects the drain of the fifth transistor and the first terminal of the first capacitive element at the time of performing the comparing process,
the first capacitive element samples the standard voltage which is a voltage of the drain of the fifth transistor at the time of the initialization, and
the second comparison result signal is output from a junction point of the third transistor and the sixth transistor.

4. The imaging device according to claim 3, wherein the comparator further includes a fourth capacitive element that has a first terminal electrically connected to the gate of the fourth transistor and a second terminal electrically connected to the drain of the fourth transistor.

* * * * *